(12) United States Patent
Lai et al.

(10) Patent No.: US 12,740,463 B2
(45) Date of Patent: Sep. 15, 2026

(54) HYBRID ORGANIC AND NON-ORGANIC INTERPOSER WITH EMBEDDED COMPONENT IN MOLDING STRUCTURE AND METHODS FOR FORMING THE SAME

(71) Applicant: Taiwan Semiconductor Manufacturing Company Limited, Hsinchu (TW)

(72) Inventors: Po-Ying Lai, Hsinchu (TW); Shuo-Mao Chen, New Taipei City (TW); Monsen Liu, Hsinchu (TW); Shang-Lun Tsai, Hsinchu City (TW); Shin-Puu Jeng, Po-Shan Village (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 537 days.

(21) Appl. No.: 17/748,345

(22) Filed: May 19, 2022

(65) Prior Publication Data

US 2023/0137691 A1 May 4, 2023

Related U.S. Application Data

(60) Provisional application No. 63/273,489, filed on Oct. 29, 2021.

(51) Int. Cl.
*H10W 20/20* (2026.01)
*H10W 70/05* (2026.01)
(Continued)

(52) U.S. Cl.
CPC ......... *H10W 70/695* (2026.01); *H10W 20/20* (2026.01); *H10W 70/05* (2026.01); *H10W 70/095* (2026.01); *H10W 70/65* (2026.01); *H10W 70/685* (2026.01); *H10W 70/698* (2026.01); *H10W 90/00* (2026.01); *H10W 90/401* (2026.01); *H10W 90/701* (2026.01);
(Continued)

(58) Field of Classification Search
CPC ........... H01L 24/16; H01L 2224/16225; H01L 2924/00014; H01L 2924/15311; H01L 25/50
See application file for complete search history.

(56) References Cited

U.S. PATENT DOCUMENTS

2010/0075427 A1* 3/2010 Kuhr ...................... H05K 3/389 436/73
2019/0259677 A1* 8/2019 Lasiter .................. H01L 23/293
(Continued)

*Primary Examiner* — Tony Tran
(74) *Attorney, Agent, or Firm* — The Marbury Law Group, PLLC

(57) ABSTRACT

Devices and methods of manufacture for a hybrid interposer including a molding structure within a semiconductor device. A semiconductor device may include a semiconductor die, a package substrate, and a hybrid interposer positioned between the semiconductor die and the package substrate. The hybrid interposer may include a molding material layer, and an integrated device positioned within the molding interposer layer. The hybrid interposer may further include an organic material layer, and a non-organic material layer. The molding material layer may include an epoxy molding compound (EMC). The organic material layer may include a dielectric polymer material. The non-organic material layer may include a silicon-based dielectric material.

18 Claims, 20 Drawing Sheets

(51) Int. Cl.

| | |
|---|---|
| ***H10W 70/65*** | (2026.01) |
| ***H10W 70/685*** | (2026.01) |
| ***H10W 70/695*** | (2026.01) |
| ***H10W 70/698*** | (2026.01) |
| ***H10W 90/00*** | (2026.01) |
| *H10W 74/00* | (2026.01) |
| *H10W 74/15* | (2026.01) |
| *H10W 74/40* | (2026.01) |

(52) U.S. Cl.

CPC ............ *H10W 74/00* (2026.01); *H10W 74/15* (2026.01); *H10W 74/40* (2026.01); *H10W 90/724* (2026.01); *H10W 90/734* (2026.01)

(56) References Cited

U.S. PATENT DOCUMENTS

2023/0005819 A1* 1/2023 Olson ................. H01L 23/5385
2023/0110957 A1* 4/2023 Yang ...................... H05K 1/181 361/783

* cited by examiner

HYBRID ORGANIC AND NON-ORGANIC INTERPOSER WITH EMBEDDED COMPONENT IN MOLDING STRUCTURE AND METHODS FOR FORMING THE SAME

RELATED APPLICATIONS

This application claims the benefit of priority from a U.S. provisional application Ser. No. 63/273,489, titled "Hybrid Organic and Non-Organic Interposer with Embedded Component in Molding Structure and Methods for Forming the Same," filed on Oct. 29, 2021, the entire contents of which are incorporated herein by reference.

BACKGROUND

Silicon interposers may be used in the semiconductor packages to communicate electrical signals between semiconductor dies and a printed circuit board (PCB). Silicon interposers may be used to redistribute and/or fan out connections of the smaller packages or semiconductor dies to a larger package, PCB or substrate. The semiconductor industry continues to improve the integration density of various electronic components, and allows more components to be integrated into a given area. These smaller electronic components include smaller packages that utilize less area and/or lower height than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
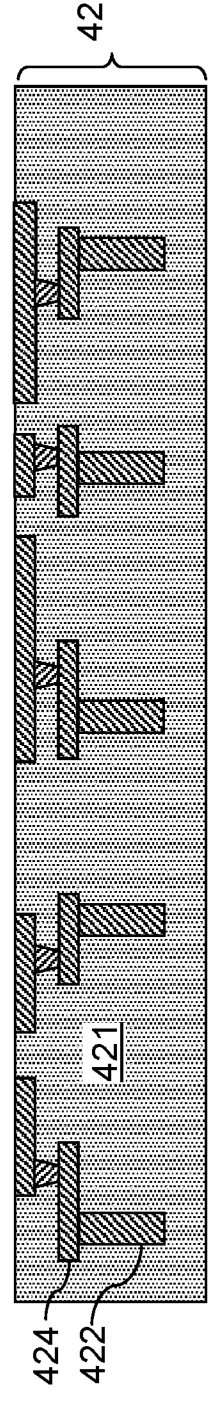
FIG. 1A is a vertical cross-sectional view of a region of an exemplary intermediate structure after a formation of a non-organic structure according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and particularly to a chip package structure containing a hybrid interposer including an integrated device and methods of forming the same.

Generally, various embodiment methods and structures may be used to provide a hybrid interposer that is more efficient and less susceptible to manufacturing defects than a conventional silicon interposer within a semiconductor package.

Silicon interposers may be used in semiconductor package to communicate electrical signals between semiconductor devices and a printed circuit board (PCB). The semiconductor devices may be logic dies, memory dies, a system-on-a-chip (SoC) or stacked memory devices. Silicon interposers may be used to redistribute and/or fan out connections of the smaller packages or semiconductor dies to a larger package, PCB or substrate. To increase semiconductor device efficiency, integrated passive devices may be embedded closely to the semiconductor dies (e.g., within the silicon interposer), instead of embedding integrated devices within the package substrate. By placing an integrated passive device closer to the semiconductor dies, electrical communication pathways are physically shorter as compared to electrical communication pathways to and from an integrated device within the package substrate. By reducing physical length of electrical communication pathways between semiconductor dies and integrated devices, processing speed may increase and the chance for hardware errors/failures may be reduced.

However, difficulties may arise when embedding an integrated device within a silicon interposer. A silicon interposer may be formed using chemical vapor deposition (CVD) processes and/or physical vapor deposition (PVD) processes. The processing temperatures used to form a silicon interposer may be high, which may limit the type of integrated devices that may be embedded within a silicon interposer. For example, an integrated device that is susceptible to damage during a high-temperature CVD or PVD process used to form layers of a silicon interposer may not be usable within a silicon interposer. Thus, damage occurs in some types of integrated devices embedded within silicon interposer.

According to an aspect of the present disclosure, the embodiment structures and methods disclosed herein may be used to increase semiconductor device efficiency and to mitigate against manufacturing defects. A hybrid interposer structure is provided, including at least one non-organic material layer and at least one organic material layer. A hybrid interposer structure may be used to provide fan-out electrical connections between semiconductor dies and a package substrate. An organic material layer may be formed between a semiconductor die and a non-organic material layer. The non-organic material layer may be formed between the organic material layer and a package substrate. Thus, a semiconductor die may communicate through wirings within the organic material layer, then through wirings within the non-organic material layer to the package substrate. The organic material layer may have a low Young's modulus, and may act as a stress buffer between the semiconductor dies and the non-organic material layer during high-stress thermal manufacturing cycles. The hybrid interposer structure may therefore better withstand higher temperature and higher stress (i.e., stress from temperature change) manufacturing cycles as compared to silicon interposers. Thus, a wider variety of integrated devices may be embedded within the hybrid interposer structure, while these integrated devices may be damaged within a conventional silicon interposer. By implementing a hybrid interposer, integrated devices may be safely embedded within the interposer during high-temperature manufacturing processes (i.e., organic material layers have low thermal expansion and contraction). Thus, integrated devices may be formed within a hybrid interposer much closer to semiconductor dies than integrated devices formed within package substrates, thereby reducing the electrical communication pathway and reducing processing time.

In various embodiments, a molding structure including molding material layer may be provided within the hybrid interposer to further increase the efficiency of and the structural integrity of the hybrid interposer. The molding structure, having a higher Young's modulus value as compared to the organic structure, may be implemented to reduce the stress of thermal expansion and contraction between thermal cycles of the manufacturing process. Thus, the chance for manufacturing defects to occur as caused by the disparity between a Young's modulus value of the package substrate and the semiconductor die may be reduced by the including a molding structure within the hybrid interposer.

The combination of an organic structure, a non-organic structure, and a molding structure to form a single hybrid interposer may create the following benefits: (i) the organic structure may enhance electrical performance; (ii) the non-organic structure may be used as a material to balance the structural integrity of the organic structure, especially during thermal cycles; and (iii) the molding structure may have a higher Young's modulus and a lower coefficient of thermal expansion as compared to other materials such as those forming the organic structure, therefore acting as a buffer between various heterogeneous layers.

In one embodiment, an integrated device may be embedded within a molding structure positioned between an organic structure and a non-organic structure. This configuration may allow the molding structure to act as a buffer between heterogeneous materials of the adjacent structures, and reduce delamination.

In one embodiment, an integrated device may be embedded within a molding structure positioned between an organic structure and a semiconductor die. This configuration may allow the molding structure to provide higher electrical performance of the semiconductor die as a result of minimizing the physical length of electrical communication pathways between the semiconductor die and the integrated device.

In one embodiment, an integrated device may be embedded within a molding structure positioned between a non-organic structure and package substrate. This configuration may allow the molding structure to increase the variety of integrated devices employable within the semiconductor structure, such that larger integrated device dimensions and pad sizes may be implemented closer to the package substrate.

The various aspects of the methods and structures of embodiments of the present disclosure are now described with reference to the accompanying drawings.

FIG. 1A is a vertical cross-sectional view of a region of an intermediate structure after formation of non-organic structure 420 according to an embodiment of the present disclosure. Referring to FIG. 1A, a non-organic structure 420 may be formed. The non-organic structure 420 may include redistribution structures that are formed on the substrate side, i.e., the side that faces semiconductor substrate to be subsequently attached. The non-organic structure 420 may include non-organic material layer 421, non-organic structure wiring interconnects 424, and through-substrate via (TSV) structures 422. The non-organic structure 420 may include a non-organic material layer 421. More than one non-organic material layer 421 may be deposited to form the non-organic structure 420. For example, the non-organic structure 420 may be formed in a series of steps such as by sequentially forming the non-organic structure wiring interconnects 424 and TSV structures 422 at each of the non-organic material layer 421.

The TSV structures 422 may be initially formed as via structures within the non-organic material layer 421 with a vertical dimension less than the thickness of the non-organic material layer 421. Subsequently, the backside of the non-organic material layer 421 may be removed such that the thickness of the non-organic material layer 421 after thinning is less than the thickness of the TSV structures 422, thereby providing the "through-silicon" configuration for the non-organic structure 420.

An array of deep trenches having a depth greater than 20 microns may be formed within each die area of the non-organic structure 420. For example, a hard mask layer (such as a silicon nitride layer and/or a borosilicate glass layer) may be formed on over a front-side surface of the non-organic material layer 421. A photoresist layer (not shown) may be applied over the hard mask layer. The photoresist layer may be lithographically patterned to form an array of openings therethrough, and the pattern of the openings may be transferred into the hard mask layer. An anisotropic etch that uses the hard mask (and optionally the patterned photoresist layer) as an etch mask may be performed to form the deep trenches that vertically extend from the front-side surface of the non-organic structure 420 toward the backside of the non-organic structure 420. The photoresist layer may be consumed during the anisotropic etch process, and the hard mask layer may be subsequently removed, for example, using a wet etch process. An array of openings, which are herein referred to as deep trenches, may vertically extend from the front-side surface of the non-organic structure 420 toward the backside surface of the non-organic structure 420.

The depth of the deep trenches may be in a range from 10 microns to 100 microns, such as from 20 microns to 60 microns, although lesser and greater depths may also be used. The lateral dimension of each deep trench (such as a diameter) may be in a range from 3 microns to 30 microns, such as from 6 microns to 15 microns, although lesser and greater lateral dimensions may also be used. Generally, the lateral dimension for the deep trenches may be selected to be large enough to provide deep etching into the non-organic material layer 421, and may be selected to be small enough to provide filling of the deep trenches with a combination of a through-substrate insulating spacer and TSV structures 422.

At least one conductive material (such as a metallic material and/or a heavily-doped semiconductor material) may be deposited in volumes of the deep trenches. For example, the at least one conductive material may include a metallic nitride liner having a thickness in a range from 30 nm to 120 nm and a metallic fill material that includes an elemental metal or an intermetallic alloy material. In an illustrative example, the metallic nitride liner may include TiN, TaN, WN, or a combination thereof, and the metallic fill material may include W, Mo, Co, Ru, or any other transition metal or an alloy thereof. Other suitable materials are within the contemplated scope of disclosure. The at least one conductive material may be patterned, for example, by applying and patterning a photoresist layer over a horizontally-extending portion of the at least one conductive material that overlies the front-side surface of the non-organic structure 420, and by transferring the pattern in the photoresist layer through the horizontally-extending portion of the at least one conductive material. In such an embodiment, remaining portions of the at least one conductive material that fill the deep trenches constitute TSV structures 422, Each of the non-organic material layer 421 may include a dielectric material that is non-organic, or inorganic. For example, the non-organic material layer 421 may be formed using silicon-based dielectric materials such as silicon oxide, porous or non-porous organosilicate glass, silicon carbon nitride, silicon nitride, or any other non-organic interconnect-level dielectric material. Each non-organic material layer 421 may be formed by spin coating and drying of the respective non-organic dielectric material. The thickness of each non-organic material layer 421 may be in a range from 2 microns to 40 microns, such as from 4 microns to 20 microns. Each non-organic material layer 421 may be patterned, for example, by applying and patterning a respective photoresist layer thereabove, and by transferring the pattern in the photoresist layer into the non-organic material layer 421 using an etch process such as an anisotropic etch process. The photoresist layer may be subsequently removed, for example, by ashing.

Each of the non-organic structure wiring interconnects 424 and TSV structures 422 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 300 nm, and the copper seed layer may have a thickness in a range from 100 nm to 500 nm. The metallic fill material for the non-organic structure wiring interconnects 424 may include copper, nickel, or copper and nickel. The thickness of the metallic fill material that is deposited for each non-organic structure wiring interconnect 424 may be in a range from 2 microns to 40 microns, such as from 4 microns to 10 microns, although lesser or greater thicknesses may also be used. Typically, the total number of levels of wiring in the non-organic structure 420 (i.e., the levels of the non-organic structure wiring interconnects 424) may be in a range from 1 to 10, although a greater number of layers may be used.

Figure 1B:
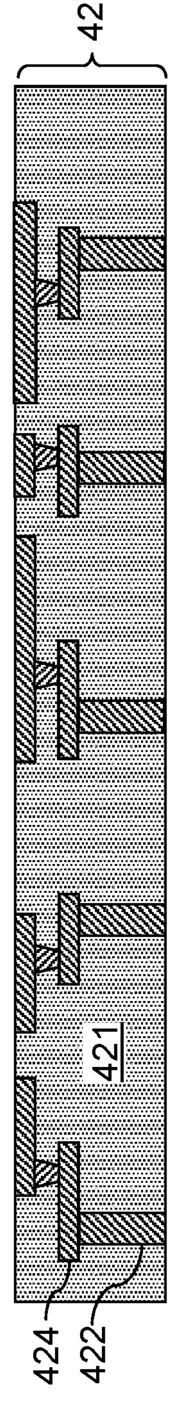
FIG. 1B is a vertical cross-sectional view of a region of an exemplary intermediate structure after removing excess portions of the non-organic material layer according to an embodiment of the present disclosure.

FIG. 1B is a vertical cross-sectional view of a region of an intermediate embodiment structure after removing excess portions of the non-organic material layer 421 according to an embodiment of the present disclosure. Referring to FIG. 3B, excess portions of the non-organic material layer 421 may be removed from below bottommost portions of the TSV structures 422. A planarization process, which may include a chemical mechanical polishing (CMP) process and/or a recess etch process, may be performed. Remaining portions of the non-organic material layer 421 may be subsequently recessed, for example, by performing a wet etch process that recesses bottommost portions of the non-organic material layer 421 down to the horizontal plane including the bottommost surfaces of the TSV structures 422. Thus, the TSV structures 422 may be exposed to be subsequently electrically connected to additional structures.

Figure 1C:
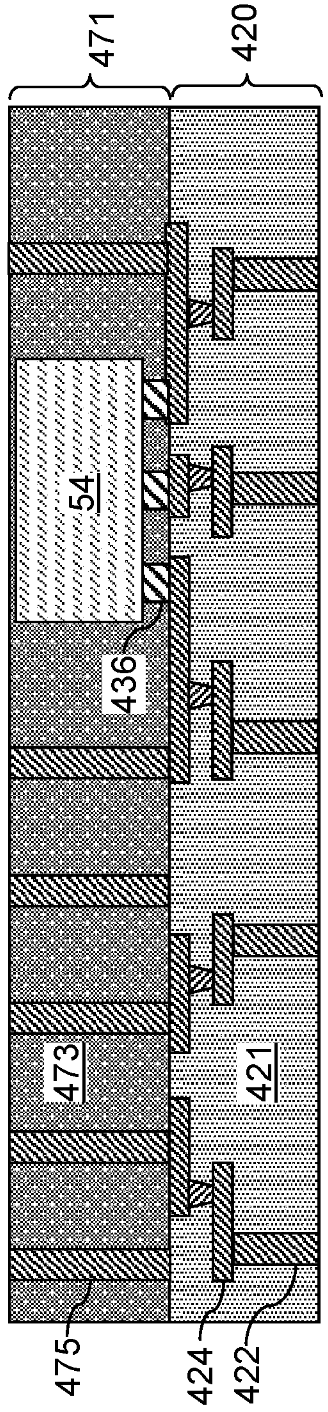
FIG. 1C is a vertical cross-sectional view of a region of an exemplary intermediate structure after forming a molding structure according to an embodiment of the present disclosure.

FIG. 1C is a vertical cross-sectional view of a region of an intermediate structure after forming a molding structure 471 according to an embodiment of the present disclosure. Referring to FIG. 1C, a molding structure 471 may be formed on the non-organic structure 420. Specifically, the molding structure 471 may be formed within each die area of the semiconductor assembly including the non-organic structure 420.

The molding structure 471 may include molding material layer 473, through-substrate via (TSV) structures 475, integrated device bumps 436, and an integrated device 54. The molding structure 471 may include a molding material layer 473. More than one molding material layer 473 may be formed by molding. For example, the molding structure 471 may be formed in a series of steps such as by sequentially forming the TSV structures 475, connecting the integrated device 54 to the non-organic structure wiring interconnects 424 through the integrated device bumps 436, and forming the molding material layer 473. The integrated device bumps 436 may be formed using a suitable deposition process that includes depositing integrated device bump material on exposed surfaces of the non-organic structure wiring interconnects 424 such that an electrical connection is formed between the non-organic structure wiring interconnects 424 and the integrated device bumps 436.

The TSV structures 475 may be initially formed as via structures within the molding material layer 473 with a vertical dimension less than the thickness of the molding material layer 473. Subsequently, the backside of the molding material layer 473 may be removed such that the thickness of the molding material layer 473 after thinning is less than the thickness of the TSV structures 475, thereby providing the "through-silicon" configuration for the molding structure 471.

At least one conductive material (such as a metallic material and/or a heavily-doped semiconductor material) may be deposited to form the TSV structures 475. For example, the at least one conductive material may include a metallic nitride liner having a thickness in a range from 30 nm to 120 nm and a metallic fill material that includes an elemental metal or an intermetallic alloy material. In an illustrative example, the metallic nitride liner may include TiN, TaN, WN, or a combination thereof, and the metallic fill material may include W, Mo, Co, Ru, or any other transition metal or an alloy thereof. Other suitable materials are within the contemplated scope of disclosure. The at least one conductive material may be patterned, for example, by applying and patterning a photoresist layer over a horizontally-extending portion of the at least one conductive material that overlies the front-side surface of the molding structure 471, and by transferring the pattern in the photoresist layer through the horizontally-extending portion of the at least one conductive material.

In one embodiment, the integrated device bumps 436 and the integrated device 54 may be formed prior to the formation and/or deposition of the molding material layer 473, and the molding material layer 473 may be subsequently formed around the exposed portions of the integrated device bumps 436 and the integrated device 54. For example, the integrated device bumps 436 and the integrated device 54 maybe formed on at least one of the non-organic structure wiring interconnects 424 to establish electrical connections with at least one of the non-organic structure wiring interconnects 424, and the molding material layer 473 may be deposited to encapsulate the integrated device bumps 436 and the integrated device 54.

Each of the molding material layer 473 may include an epoxy molding compound (EMC). The molding material layer 473 may include an epoxy-containing compound that may be hardened (i.e., cured) to provide a dielectric material portion having sufficient stiffness and mechanical strength. The molding material layer 473 may include epoxy resin, hardener, silica (as a filler material), and other additives. The molding material layer 473 may be provided in a liquid form or in a solid form depending on the viscosity and flowability. Liquid EMC typically provides better handling, good flowability, less voids, better fill, and less flow marks. Solid EMC typically provides less cure shrinkage, better stand-off, and less die drift. A high filler content (such as 85% in weight) within an EMC may shorten the time in mold, lower the mold shrinkage, and reduce the mold warpage. Uniform filler size distribution in the EMC may reduce flow marks, and may enhance flowability. The curing temperature of the EMC may be in a range from 125° C. to 150° C.

Excess portions of the molding material layer 473 may be removed from above the horizontal plane of the topmost surface of the molding material layer 473 by performing a planarization process, which may include a chemical mechanical polishing (CMP) process and/or a recess etch process. Remaining portions of the molding material layer 473 may be subsequently recessed, for example, by performing a wet etch process that recesses top surfaces of the remaining portions of the molding material layer 473 down to a same horizontal plane including topmost and bottommost surfaces of the TSV structures 475.

In some embodiments, the integrated device 54 may be formed within the molding structure 471. For example, in one embodiment, the integrated device bumps 436 and the integrated device 54 may be formed consecutively, and a molding material may be deposited at each layer during each manufacturing step. In another embodiment, the integrated device bumps 436 and the integrated device 54 may be formed consecutively, and a molding material may be deposited to fill in gaps around the integrated device bumps 436 and the integrated device 54. In a further embodiment, a molding material may be deposited and the integrated device bumps 436 and the integrated device 54 may be formed into the molding material (e.g., prior to the molding material hardening).

In some embodiments, the integrated device bumps 436 may be formed at a topmost layer of the molding structure 471, and the integrated device 54 may be formed prior to and beneath the integrated device bumps 436, such that a topmost surface of the integrated device bumps 436 are on a same horizontal plane as the topmost surfaces of the TSV structures 475. In some embodiments, integrated device bumps 436 may be formed on both the top and bottom surfaces of the integrated device 54, such that the integrated device 54 may have top and bottom electrical connections available.

A molding material may be molded around the TSV structures 475, the integrated device bumps 436, and the integrated device 54 to form at least one molding material layer 473. In some embodiments, the molding material may be deposited by a suitable deposition process such as a chemical vapor deposition (CVD) process. Herein, suitable deposition processes may include CVD, physical vapor deposition (PVD), atomic layer deposition (ALD), high density plasma CVD (HDPCVD), metalorganic CVD (MOCVD), plasma enhanced CVD (PECVD), sputtering, laser ablation, or the like. For example, a chemical vapor deposition process may be used to deposit the molding material.

In one embodiment, the molding material may include an epoxy molding compound (EMC). The molding material may include an epoxy-containing compound that may be hardened (i.e., cured) to provide a dielectric material portion having sufficient stiffness and mechanical strength. The molding material may include epoxy resin, hardener, silica (as a filler material), and other additives. The molding material may be provided in a liquid form or in a solid form depending on the viscosity and flow ability. Liquid EMC typically provides better handling, good flowability, less voids, better fill, and less flow marks. Solid EMC typically provides less cure shrinkage, better stand-off, and less die drift. A high filler content (such as 85% in weight) within an EMC may shorten the time in mold, lower the mold shrinkage, and reduce the mold warpage. Uniform filler size distribution in the EMC may reduce flow marks, and may enhance flowability. The curing temperature of the EMC may be in a range from 125° C. to 150° C.

Excess portions of the molding material may be removed from above the horizontal plane of the topmost surfaces of the TSV structures 475 and/or the integrated device 54 by performing a planarization process, which may include a chemical mechanical polishing (CMP) process and/or a recess etch process. Remaining portions of the molding material may be subsequently recessed, for example, by performing a wet etch process that recesses top surfaces of the remaining portions of the molding material down to the horizontal plane including the topmost surface of the TSV structures 475 and/or the integrated device 54 material layer.

The integrated device bumps 436 may be formed to be in electrical connection with wirings or electrical connections (not shown) of the integrated device 54. In one embodiment, the integrated device bumps 436 may include copper pads or copper pillars that may be employed as bumps, or microbumps. In some embodiments, connections between the integrated device 54 and non-organic structure wiring interconnects 424 are formed by solder bumps, Cu to Cu bond by thermal compression bonding (TCB).

The metallic fill material for the integrated device bumps 436 may include copper. The thickness of the metallic fill material that is deposited for the integrated device bumps 436 may be in a range from 5 microns to 100 microns, although lesser or greater thicknesses may also be used. The integrated device bumps 436 may have horizontal cross-sectional shapes of rectangles, rounded rectangles, or circles. If the integrated device bumps 436 are formed as C4 (controlled collapse chip connection) pads, the thickness of the integrated device bumps 436 may be in a range from 5 microns to 50 microns, although lesser or greater thicknesses may also be used. Alternatively, the integrated device bumps 436 may be configured for bump bonding (i.e., C2 bonding), and may have a thickness in a range from 30 microns to 100 microns, although lesser or greater thicknesses may also be used. In such an embodiment, the integrated device bumps 436 may be formed as an array of microbumps (such as copper pillars) having a lateral dimension in a range from 10 microns to 25 microns, and having a pitch in a range from 20 microns to 50 microns.

The integrated device 54 may be any type of device, such as an active device, such as a voltage regulator, or an integrated passive device (IPD), such as resistors, capacitors, inductors, microstrip lines, impedance matching elements, baluns, the like, or any combinations thereof. The integrated device 54 is illustrated generically as a patterned box, but may contain any circuitry, wiring, or materials used to implement the aforementioned example devices. Any suitable manufacturing process to form any type of integrated device 54 may be used. In some embodiments, the integrated device 54 is the IPD, which may be small enough to be embedded between the TSV structures 475.

Each of the integrated device bumps 436, TSV structures 422, and portions of the integrated device 54 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 300 nm, and the copper seed layer may have a thickness in a range from 100 nm to 500 nm. The metallic fill material for the integrated device bumps 436, TSV structures 422, and portions of the integrated device 54 may include copper, nickel, or copper and nickel.

Figure 1D:
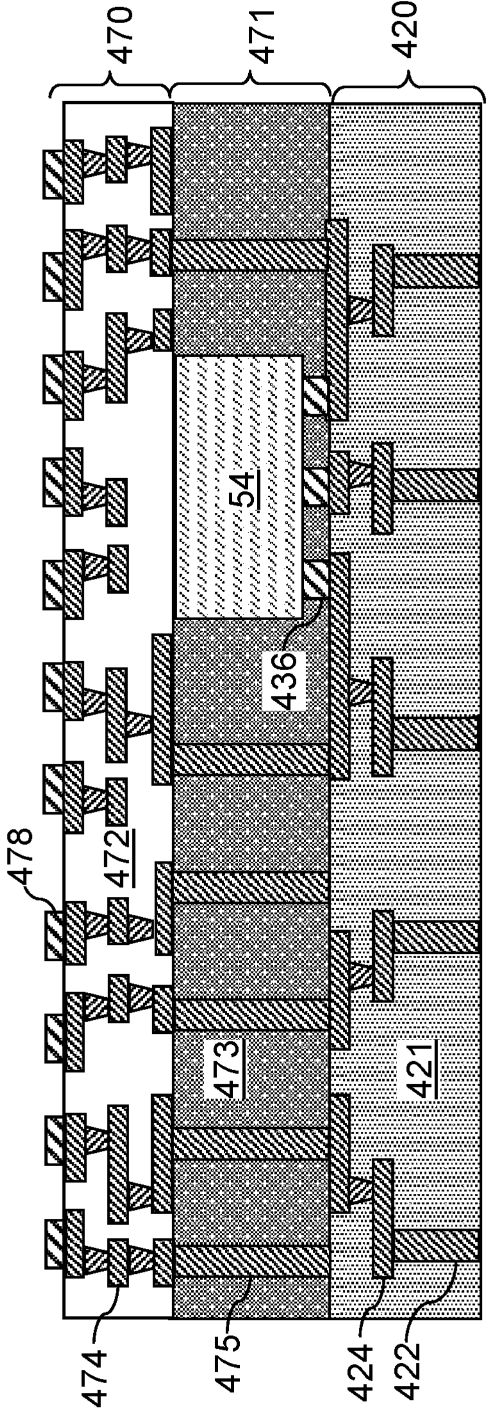
FIG. 1D is a vertical cross-sectional view of a region of an exemplary intermediate structure after forming an organic structure according to an embodiment of the present disclosure.

FIG. 1D is a vertical cross-sectional view of a region of an intermediate structure after forming an organic structure 470 according to an embodiment of the present disclosure. Referring to FIG. 1D, an organic structure 470 may be formed on the molding structure 471. Specifically, an organic structure 470 may be formed within each die area of the semiconductor assembly including the non-organic structure 420 and the molding structure 471. The organic structure 470 may include redistribution structures that are formed on the die side, i.e., the side that faces semiconductor dies to be subsequently attached, with respect to the assembly of the non-organic structure 420 and the molding structure 471.

The organic structure 470 may include an organic material layer 472, organic structure wiring interconnects 474, and die-side bonding pads 478. More than one organic material layer 472 may be deposited to form the organic structure 470. The organic material layer 472 may include organic materials. Organic materials may include a dielectric polymer material such as polyimide (PI), benzocyclobutene (BCB), or polybenzobisoxazole (PBO). Each organic material layer 472 may be formed by spin coating and drying of the respective dielectric polymer material. The thickness of each organic material layer 472 may be in a range from 2 microns to 40 microns, such as from 4 microns to 20 microns. Each organic material layer 472 may be patterned, for example, by applying and patterning a respective photoresist layer thereabove, and by transferring the pattern in the photoresist layer into the organic material layer 472 using an etch process such as an anisotropic etch process. The photoresist layer may be subsequently removed, for example, by ashing.

Each of the organic structure wiring interconnects 474 and the die-side bonding pads 478 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 300 nm, and the copper seed layer may have a thickness in a range from 100 nm to 500 nm, although greater or lesser thicknesses may be used. The metallic fill material for the organic structure wiring interconnects 474 may include copper, nickel, or copper and nickel. Other suitable metallic fill materials are within the contemplated scope of disclosure. The thickness of the metallic fill material that may be deposited for each organic structure wiring interconnect 474 may be in a range from 2 microns to 40 microns, such as from 4 microns to 10 microns, although lesser or greater thicknesses may also be used.

The metallic fill material for the die-side bonding pads 478 may include copper. The thickness of the metallic fill material that is deposited for the die-side bonding pads 478 may be in a range from 5 microns to 100 microns, although lesser or greater thicknesses may also be used. The die-side bonding pads 478 may have horizontal cross-sectional shapes of rectangles, rounded rectangles, or circles. If the die-side bonding pads 478 are formed as C4 (controlled collapse chip connection) pads, the thickness of the die-side bonding pads 478 may be in a range from 5 microns to 50 microns, although lesser or greater thicknesses may also be used. Alternatively, the die-side bonding pads 478 may be configured for microbump bonding (i.e., C2 bonding), and may have a thickness in a range from 30 microns to 100 microns, although lesser or greater thicknesses may also be used. In such an embodiment, the die-side bonding pads 478 may be formed as an array of microbumps (such as copper pillars) having a lateral dimension in a range from 10 microns to 25 microns, and having a pitch in a range from 20 microns to 50 microns.

Figure 1E:
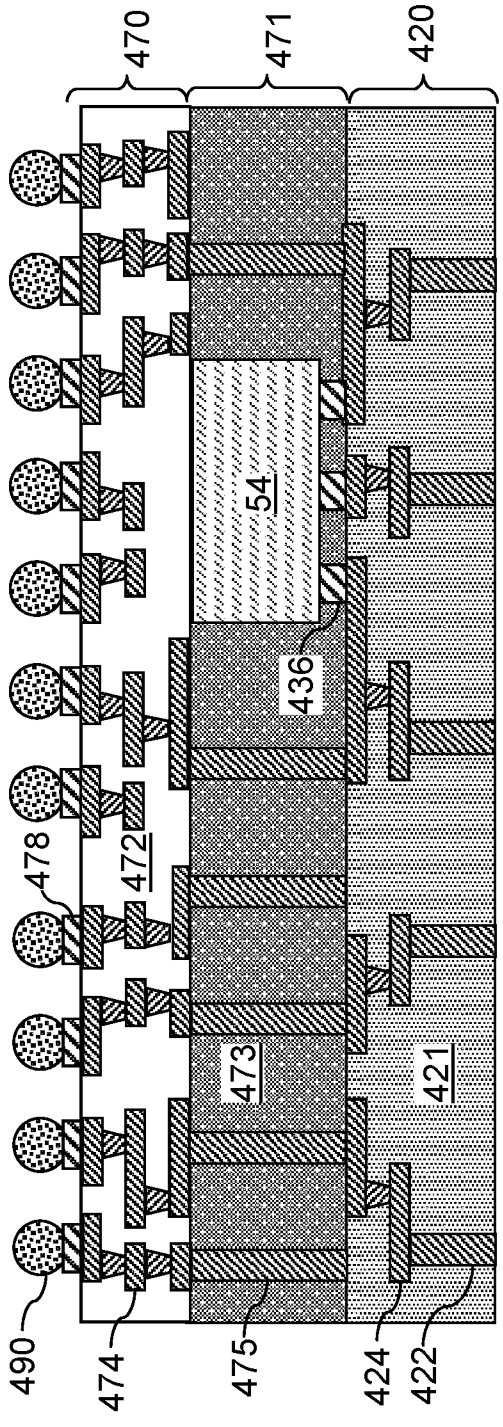
FIG. 1E is a vertical cross-sectional view of a region of an exemplary intermediate structure after attaching solder material portions according to an embodiment of the present disclosure.

FIG. 1E is a vertical cross-sectional view of a region of an intermediate structure after attaching solder material portions 490 according to an embodiment of the present disclosure. Referring to FIG. 1E, solder material portions 490 may be attached to the die-side bonding pads 478. In embodiments in which the die-side bonding pads 478 include C4 bonding pads, the solder material portions 490 may be C4 solder balls, i.e., solder material portions in the shapes of balls that may be used for C4 bonding. In embodiments in which the die-side bonding pads 478 include an array of microbumps for C2 bonding, the solder material portions 490 may be solder caps that wet the entirety of a planar end surface of a respective microbump and have generally hemispherical shapes. In one embodiment, the solder material portions 490 may comprise an array of cylindrical copper pillars each having a horizontal cross-sectional shape of a circle with a diameter in a range from 10 microns to 25 microns. While the present disclosure is described using an embodiment in which the solder material portions 490 are represented by spherical C4 solder balls, embodiments are expressly contemplated herein in which the solder material portions 490 may be solder caps having hemispherical shapes.

Figure 1F:
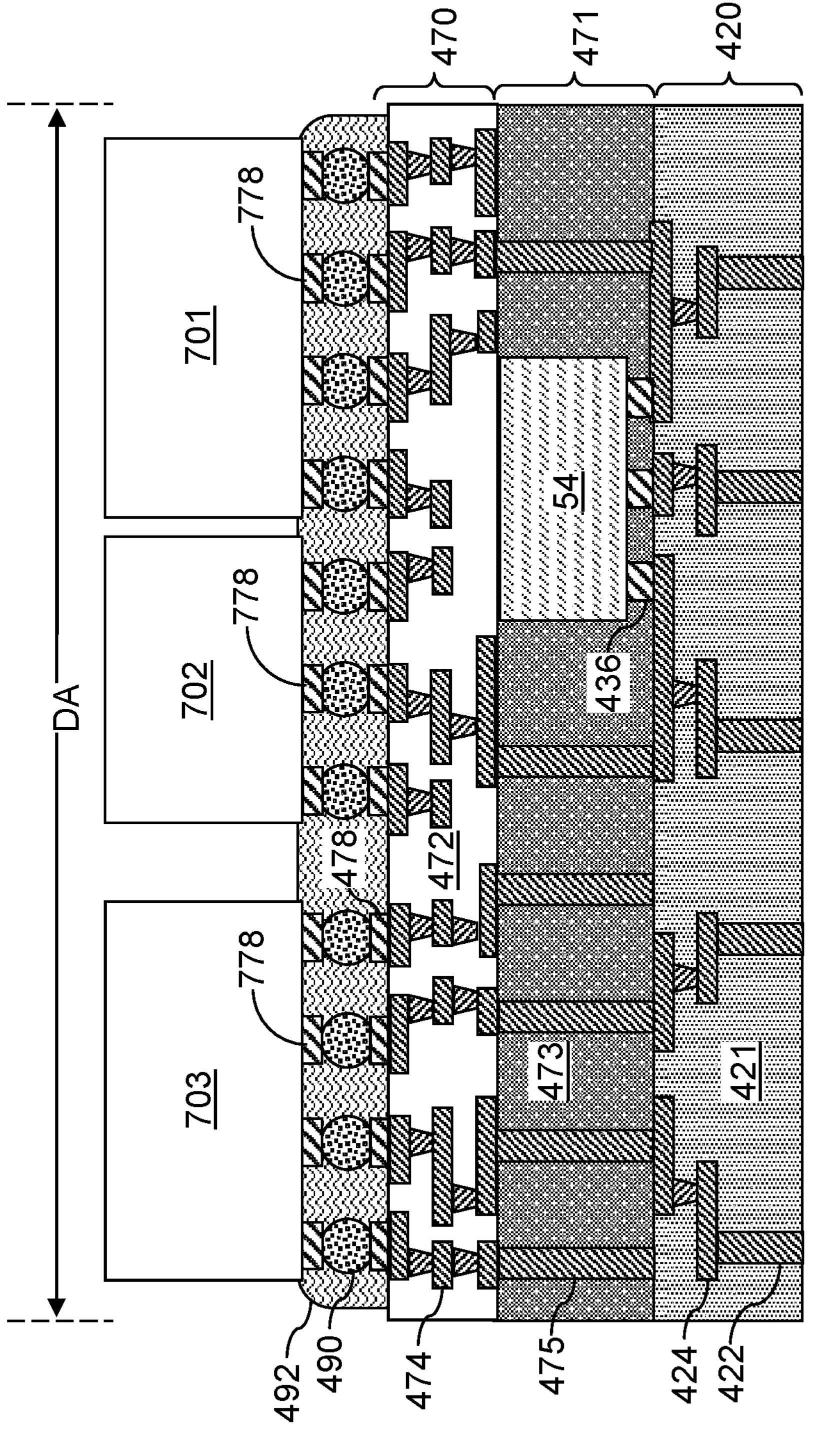
FIG. 1F is a vertical cross-sectional view of a region of an exemplary intermediate structure after attaching at least one semiconductor die to the organic structure according to an embodiment of the present disclosure.

FIG. 1F is a vertical cross-sectional view of a region of an intermediate structure after attaching at least one semiconductor die (701, 702, 703) to the organic structure 470 according to an embodiment of the present disclosure. Referring to FIG. 1F, at least one semiconductor die (701, 702, 703) may be attached to the organic structure 470, which is located within a respective die area DA. Thus, at least one semiconductor die (701, 702, 703) may be electrically connected to a respective integrated device 50 located within a respective die area DA. In some embodiments, the organic structure 470 may be referred to as a die-side redistribution structure.

Each semiconductor die (701, 702, 703) may be bonded to a respective subset of the die-side bonding pads 478 through a respective subset of the solder material portions 490. In one embodiment, at least one semiconductor die (701, 702, 703) may be attached to the organic structure 470 through an array of microbumps. In one embodiment, a plurality of semiconductor dies (701, 702, 703) may be attached to the organic structure 470 through an array of microbumps or through arrays of microbumps. In such an embodiment, at least one of the semiconductor dies (701, 702, 703) includes an array of microbumps 778 having the same pitch as the die-side bonding pads 478, which include another array of microbumps. A C2 bonding process that reflows the solder material portions 490 may be performed after each array of microbumps 778 of the at least one of the semiconductor dies (701, 702, 703) is disposed over the array of solder material portions 490.

At least one underfill material portion 492 may be formed around each bonded array of solder material portions 490. Each underfill material portion 492 may be formed by injecting an underfill material around the array of solder material portions 490 after the solder material portions 490 are reflowed. Any known underfill material application method may be used, which may be, for example, the capillary underfill method, the molded underfill method, or the printed underfill method. In one embodiment, a plurality of semiconductor dies (701, 702, 703) may be attached to the organic structure 470 within each die area DA, and a single underfill material portion 492 may continuously extend underneath the plurality of semiconductor dies (701, 702, 703).

The at least one semiconductor die (701, 702, 703) may include any semiconductor die known in the art. In one embodiment, the at least one semiconductor die (701, 702, 703) may include a system-on-chip (SoC) die such as an application processor die. In one embodiment, the at least one semiconductor die (701, 702, 703) may include a plurality of semiconductor dies (701, 702, 703). In one embodiment, the plurality of semiconductor dies (701, 702, 703) may include a first semiconductor die 701 and at least one second semiconductor die 702. In one embodiment, the first semiconductor die 701 may be a central processing unit die, and the at least one second semiconductor die 702 may include a graphic processing unit die. In another embodiment, the first semiconductor die 701 may include a system-on-chip (SoC) die, and the at least one second semiconductor die 702 may include at least one high bandwidth memory (HBM) die, each of which includes a vertical stack of static random access memory dies and provides high bandwidth under JEDEC standards, i.e., standards by The JEDEC Solid State Technology Association. In another embodiment, the first semiconductor die 701 may include a system-on-chip (SoC) die, and the at least one second semiconductor die 702 may include at least one three-dimensional integrated circuit (3DIC) die. The top surfaces of the semiconductor dies (701, 702, 703) that are attached to the organic structure 470 may be positioned within a same horizontal plane.

Die-side metal interconnect structures (not shown) may be employed as segments of high-speed inter-die electrically conductive paths between the semiconductor dies (701, 702, 703). Specifically, the combination of the organic structure wiring interconnects 474 and the die-side metal interconnect structures may be employed to enable high-speed signal transmission between the semiconductor dies (701, 702, 703). In one embodiment, the semiconductor dies (701, 702, 703) may include a system-on-chip (SoC) die and at least one high bandwidth memory die, and the combination of the organic structure wiring interconnects 474 and the die-side metal interconnect structures may be employed to provide high speed communication between the system-on-chip die and the at least one high bandwidth memory die. In one embodiment, the semiconductor dies (701, 702, 703) may include a graphic processing unit (GPU) and at least one high bandwidth memory die, and the combination of the organic structure wiring interconnects 474 and the die-side metal interconnect structures may be employed to provide high speed communication between the graphic processing unit and the at least one high bandwidth memory die.

Figure 1G:
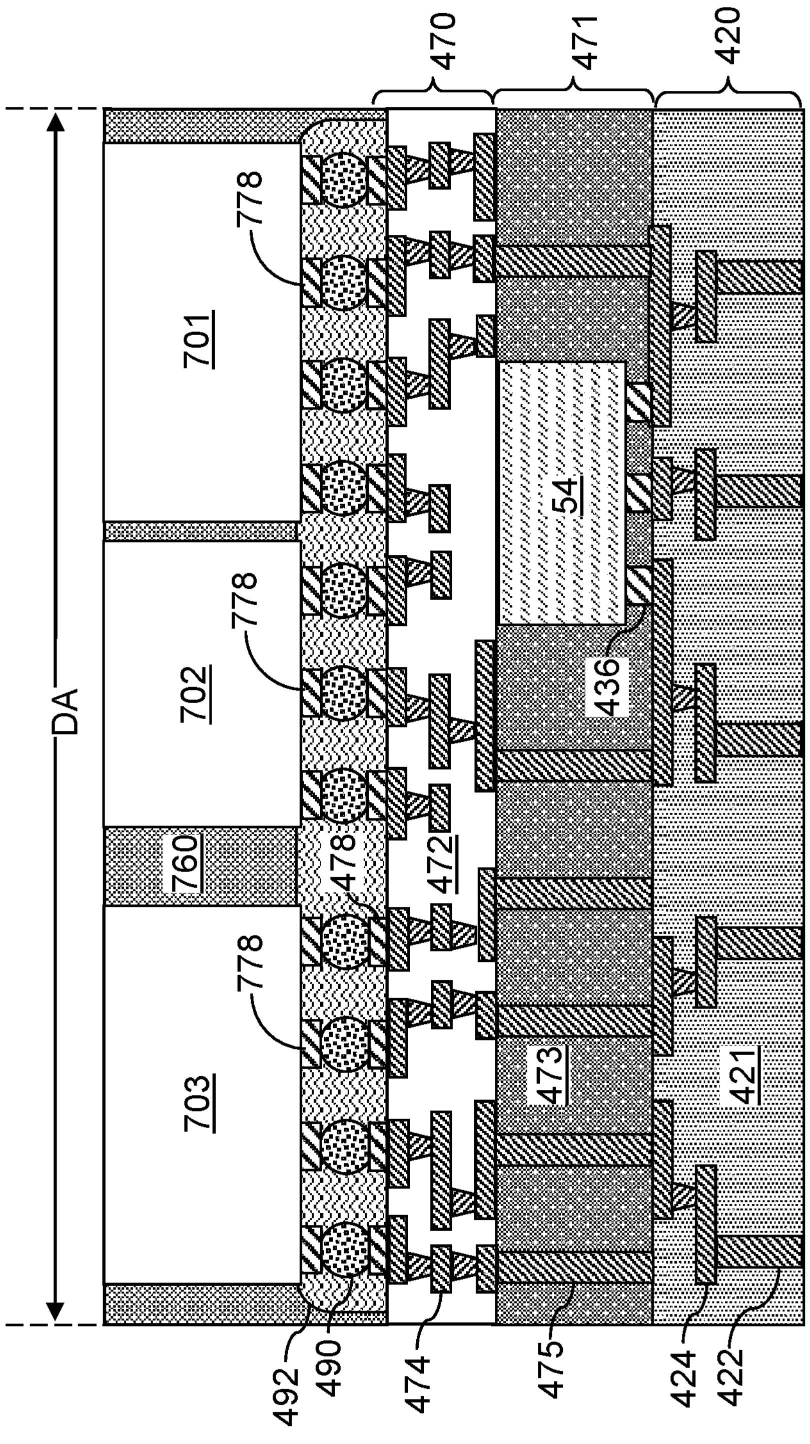
FIG. 1G is a vertical cross-sectional view of a region of an exemplary intermediate structure after depositing an epoxy molding compound according to an embodiment of the present disclosure.

FIG. 1G is a vertical cross-sectional view of a region of an intermediate structure after depositing an epoxy molding compound according to an embodiment of the present disclosure. Referring to FIG. 1G, another encapsulant, such as an epoxy molding compound (EMC), may be applied to the gaps between the semiconductor dies (701, 702, 703). The EMC applied at this processing step may use any of the EMC materials that may be used to form the molding material layer 473 as described above. The EMC may be cured at a curing temperature to form an EMC matrix that laterally encloses each of the semiconductor dies (701, 702, 703). The EMC matrix includes a plurality of epoxy molding compound (EMC) die frames 760 that may be laterally adjoined to one another. Each EMC die frame 760 may be located within a respective die area DA, and may be formed to laterally surround a respective set of at least one semiconductor die (701, 702, 703) that is bonded to an underlying organic structure 470. Excess portions of the EMC may be removed from above the horizontal plane including the top surfaces of the semiconductor dies (701, 702, 703) by a planarization process, which may use chemical mechanical planarization. Generally, each EMC die frame 760 laterally surrounds at least one semiconductor die (701, 702, 703).

Figure 1H:
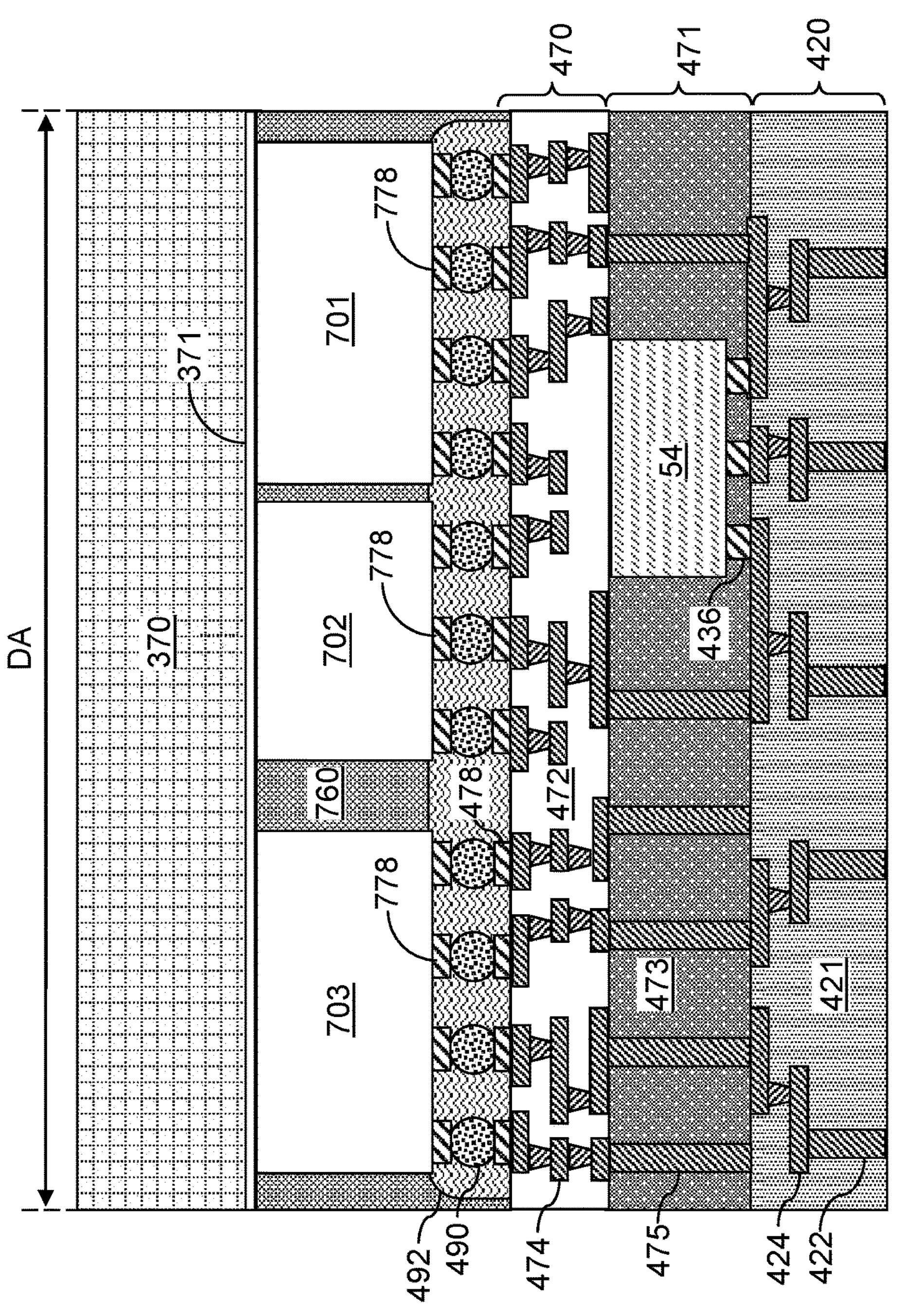
FIG. 1H is a vertical cross-sectional view of a region of an exemplary intermediate structure after attaching a carrier substrate according to an embodiment of the present disclosure.

FIG. 1H is a vertical cross-sectional view of a region of an intermediate structure after attaching a carrier substrate according to an embodiment of the present disclosure. Referring to FIG. 1H, a carrier substrate 370 may be attached to the semiconductor dies (701, 702, 703) and the EMC die frames 760. A suitable temporary adhesive layer 371 may be used. The temporary adhesive layer 371 may include a light-to-heat conversion (LTHC) layer in embodiments in which the carrier substrate 370 includes an optically transparent material. Alternatively, the temporary adhesive layer 371 may include a thermally deactivated adhesive material.

Figure 1I:
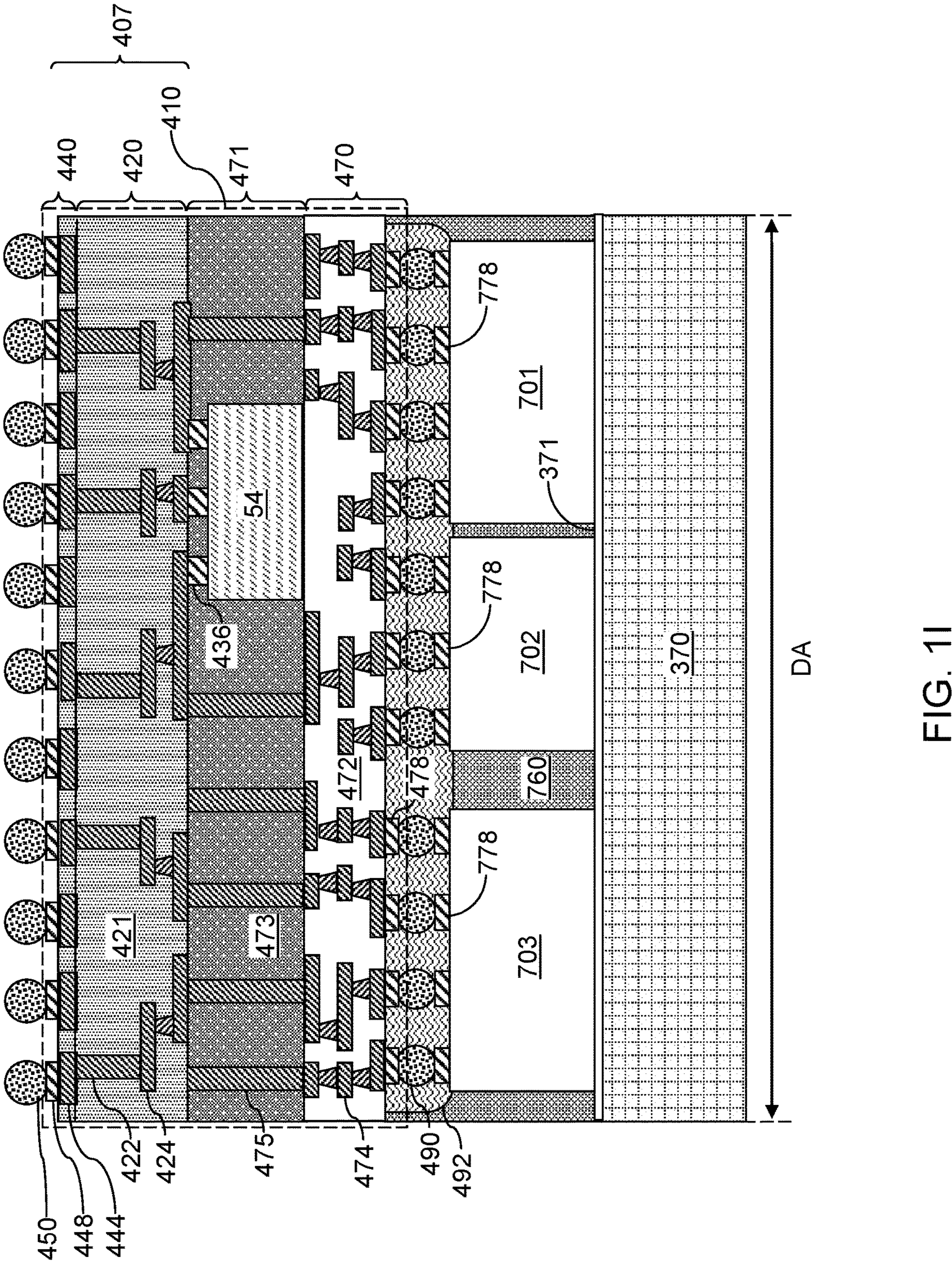
FIG. 1I is a vertical cross-sectional view of a region of an exemplary intermediate structure after forming a package-side redistribution structure according to an embodiment of the present disclosure.

FIG. 1I is a vertical cross-sectional view of a region of an intermediate structure after forming a package-side redistribution structure 440 according to an embodiment of the present disclosure. Referring to FIG. 1I, a package-side redistribution structure 440 may be formed on non-organic structure 420. Specifically, a package-side redistribution structure 440 may be formed within each die area DA of the assembly including the non-organic structure 420. The package-side redistribution structure 440 includes redistribution structures that are formed on the substrate side, i.e., the side that faces a package substrate to be subsequently attached, with respect to the assembly of the non-organic structure 420.

The package-side redistribution structure 440 may include package-side redistribution dielectric layers, package-side redistribution wiring interconnects 444, and package-side bonding pads 448. The package-side redistribution dielectric layers may include non-organic materials, (i.e., silicon-based dielectric materials) such as silicon oxide, porous or non-porous organosilicate glass, silicon carbon nitride, silicon nitride, or any other non-organic dielectric material. Each package-side redistribution dielectric layer may be formed by spin coating and drying of the respective non-organic dielectric material. The thickness of each package-side redistribution dielectric layer may be in a range from 2 microns to 40 microns, such as from 4 microns to 20 microns. Each package-side redistribution dielectric layer may be patterned, for example, by applying and patterning a respective photoresist layer thereabove, and by transferring the pattern in the photoresist layer into the package-side redistribution dielectric layer using an etch process such as an anisotropic etch process. The photoresist layer may be subsequently removed, for example, by ashing.

Each of the package-side redistribution wiring interconnects 444 and the package-side bonding pads 448 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 300 nm, and the copper seed layer may have a thickness in a range from 100 nm to 500 nm. The metallic fill material for the package-side redistribution wiring interconnects 444 may include copper, nickel, or copper and nickel. The thickness of the metallic fill material that is deposited for each package-side redistribution wiring interconnect 444 may be in a range from 2 microns to 40 microns, such as from 4 microns to 10 microns, although lesser or greater thicknesses may also be used.

The metallic fill material for the package-side bonding pads 448 may include copper, although other conductive metallic fill materials are within the contemplated scope of disclosure. The thickness of the metallic fill material that is deposited for the package-side bonding pads 448 may be in a range from 5 microns to 100 microns, although lesser or greater thicknesses may also be used. The package-side bonding pads 448 may have horizontal cross-sectional shapes of rectangles, rounded rectangles, or circles. In embodiments in which the package-side bonding pads 448 are formed as C4 (controlled collapse chip connection) pads, the thickness of the package-side bonding pads 448 may be in a range from 5 microns to 50 microns, although lesser or greater thicknesses may also be used.

Solder material portions 450 may be attached to the package-side bonding pads 448. In embodiments in which the package-side bonding pads 448 include C4 bonding pads, the solder material portions 450 may be C4 solder balls, i.e., solder material portions in the shapes of balls that may be used for C4 bonding. In embodiments in which the package-side bonding pads 448 include an array of microbumps for C2 bonding, the solder material portions 450 may be solder caps that wet the entirety of a planar end surface of a respective microbump and have generally hemispherical shapes.

Figure 1J:
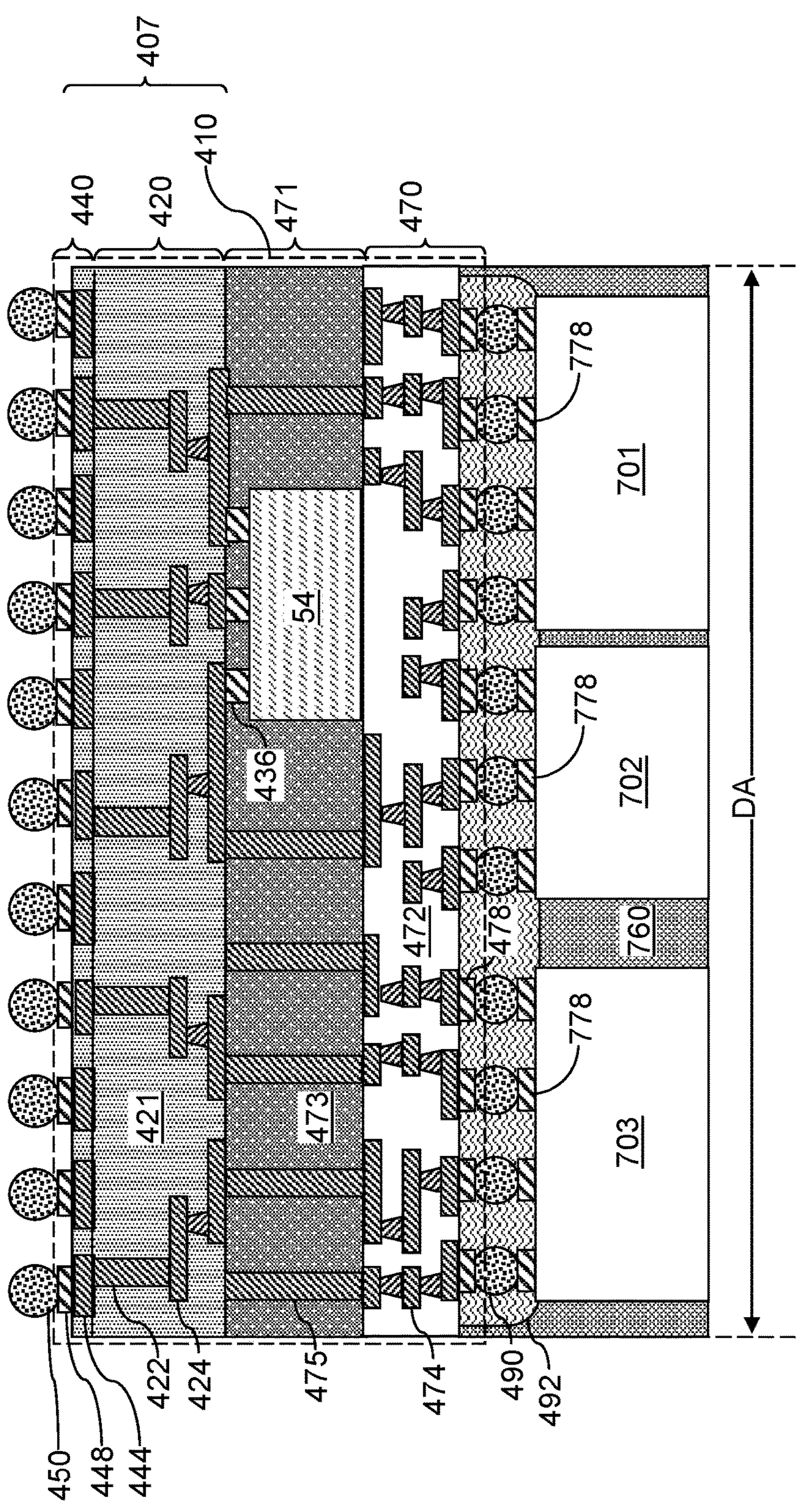
FIG. 1J is a vertical cross-sectional view of a region of an exemplary intermediate structure after detaching the carrier substrate according to an embodiment of the present disclosure.

FIG. 1J is a vertical cross-sectional view of a region of an intermediate structure after detaching the carrier substrate 370 according to an embodiment of the present disclosure. Referring to FIG. 1J, the assembly of the hybrid interposer 410, the two-dimensional array of semiconductor dies (701, 702, 703), and a two-dimensional array of EMC die frames 760 may be detached from the carrier substrate 370. The temporary adhesive layer (not shown) located between the carrier substrate 370 and the two-dimensional array of EMC die frames 760 may be debonded by a suitable method, which may use irradiation of ultraviolet radiation onto the temporary adhesive layer or a thermal anneal.

Figure 1K:
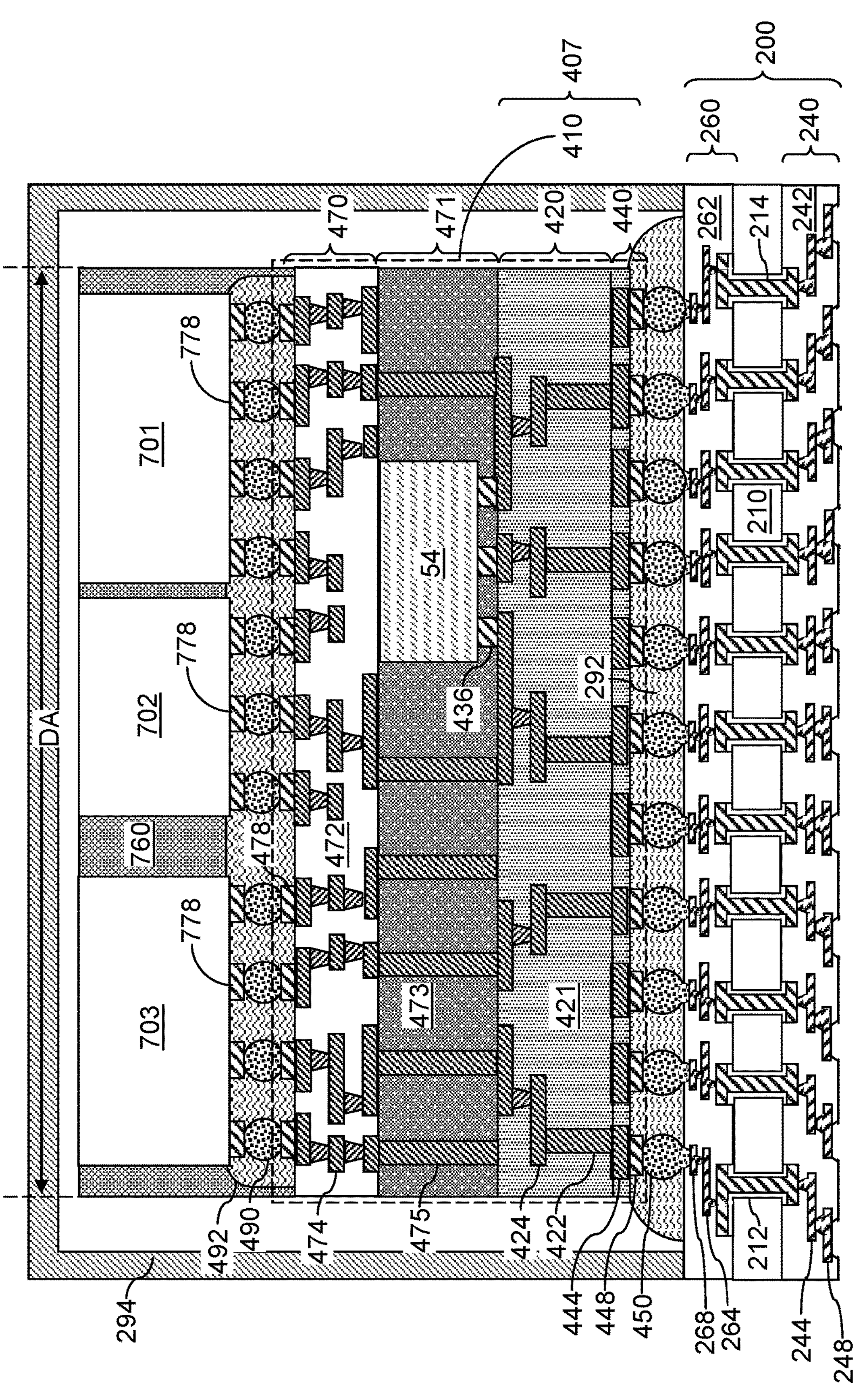
FIG. 1K is a vertical cross-sectional view of a region of an exemplary intermediate structure after forming a package substrate according to an embodiment of the present disclosure.

FIG. 1K is a vertical cross-sectional view of a region of an intermediate structure after forming a package substrate 200 according to an embodiment of the present disclosure. Referring to FIG. 1K, a package substrate 200 may be provided. The package substrate 200 may be a cored package substrate including a core substrate 210, or a coreless package substrate that does not include a package core. The core substrate 210 may include a glass epoxy plate including an array of through-plate holes. An array of through-core via structures 214 including a metallic material may be provided in the through-plate holes. Each through-core via structure 214 may, or may not, include a cylindrical hollow therein. Optionally, dielectric liners 212 may be used to electrically isolate the through-core via structures 214 from the core substrate 210.

The package substrate 200 may include board-side surface laminar circuit (SLC) 240 and a chip-side surface laminar circuit (SLC) 260. The board-side SLC 240 may include board-side insulating layers 242 with board-side wiring interconnects 244 formed therein. The chip-side SLC 260 may include chip-side insulating layers 262 with chip-side wiring interconnects 264 formed therein. The board-side insulating layers 242 and the chip-side insulating layers 262 may include a photosensitive epoxy material that may be lithographically patterned and subsequently cured. The board-side wiring interconnects 244 and the chip-side wiring interconnects 264 may include copper that may be deposited by electroplating within patterns in the board-side insulating layers 242 or the chip-side insulating layers 262. An array of board-side bonding pads 248 may be electrically connected to the board-side wiring interconnects 244, and may be configured to allow bonding through solder balls. An array of chip-side bonding pads 268 may be electrically connected to the chip-side wiring interconnects 264, and may be configured to allow bonding through C4 solder balls.

The solder material portions 450 attached to the package-side bonding pads 448 of an assembly of a hybrid interposer 410, at least one semiconductor die (701, 702, 703), and an EMC die frame 760 may be disposed on the array of the chip-side bonding pads 268 of the package substrate 200. A reflow process may be performed to reflow the solder material portions 450, thereby inducing bonding between the hybrid interposer 410 and the package substrate 200. In one embodiment, the solder material portions 450 may include C4 solder balls, and the assembly of the hybrid interposer 410, the at least one semiconductor die (701, 702, 703), and the EMC die frame 760 may be attached to the package substrate 200 using an array of C4 solder balls. An underfill material portion 292 may be formed around the solder material portions 450 by applying and shaping an underfill material. Optionally, a stabilization structure 294, such as a cap structure or a ring structure, may be attached to the assembly of the hybrid interposer 410, the at least one semiconductor die (701, 702, 703), the EMC die frame 760, and the package substrate 200 to reduce deformation of the assembly during subsequent processing steps and/or during usage of the assembly.

Figure 1L:
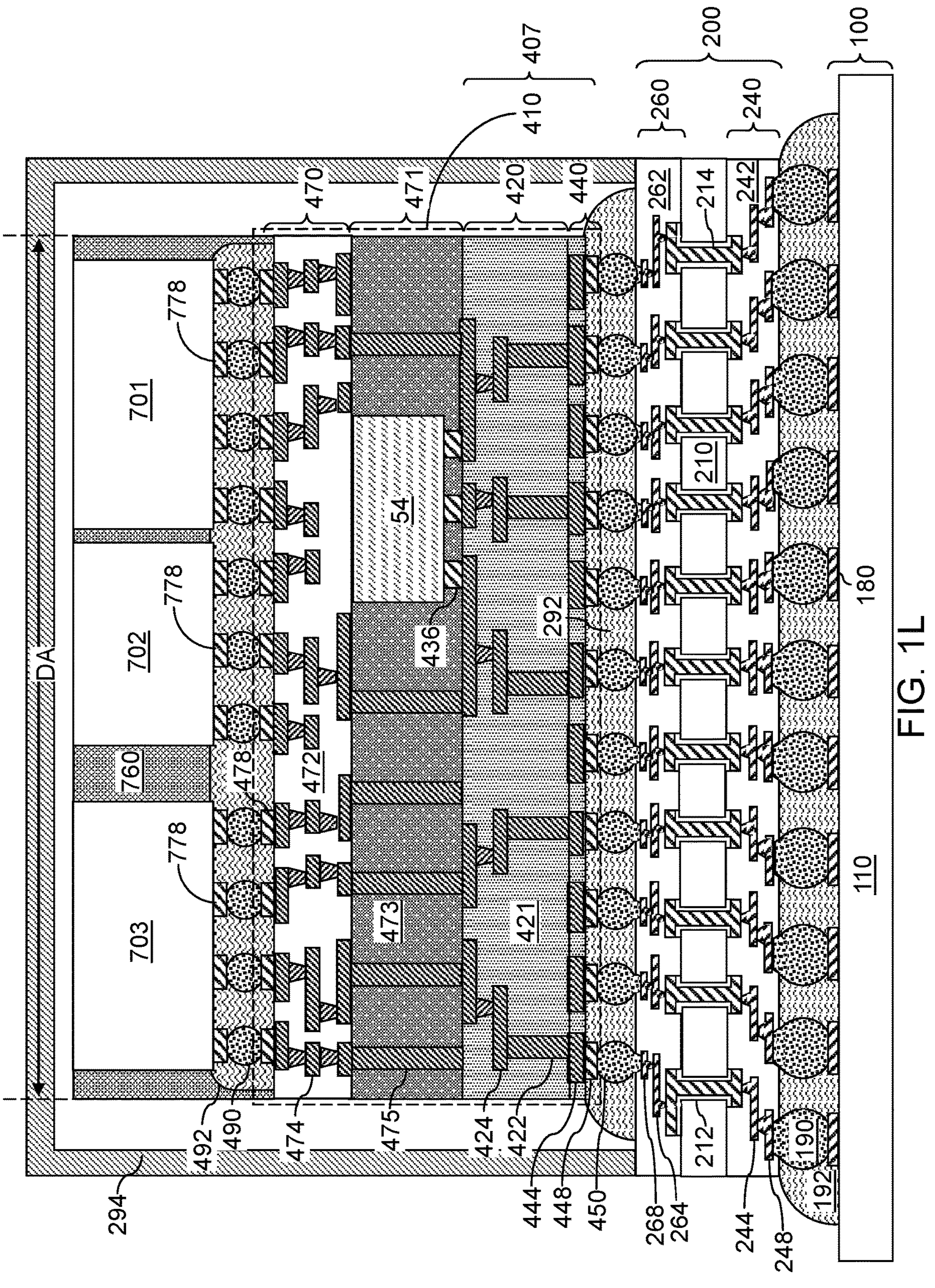
FIG. 1L is a vertical cross-sectional view of a region of the exemplary structure after forming a printed circuit board (PCB) according to an embodiment of the present disclosure.

FIG. 1L is a vertical cross-sectional view of a region of an intermediate structure after forming a printed circuit board (PCB) 100 according to an embodiment of the present disclosure. Referring to FIG. 1N, a PCB 100 including a PCB substrate 110 and PCB bonding pads 180 may be provided. The PCB 100 includes a printed circuitry (not shown) at least on one side of the PCB substrate 110. An array of solder joints 190 may be formed to bond the array of board-side bonding pads 248 to the array of PCB bonding pads 180. The solder joints 190 may be formed by disposing an array of solder balls between the array of board-side bonding pads 248 and the array of PCB bonding pads 180, and by reflowing the array of solder balls. An underfill material portion 192 may be formed around the solder joints 190 by applying and shaping an underfill material. The package substrate 200 may be attached to the PCB 100 through the array of solder joints 190.

A hybrid interposer 410 may be formed from the non-organic structure 420, the package-side redistribution structure 440, the molding structure 471, and the organic structure 470. The hybrid interposer 410 may include non-organic material layer 407, molding material layer 473, and organic material layer 472. The non-organic material layer 407 may include the non-organic structure 420 and the package-side redistribution structure 440. Thus, the hybrid interposer 410 may include non-organic material layer 407, organic material layer 472, and molding material layer 473 positioned between the non-organic material layer 407 and the organic material layer 472.

The at least one semiconductor die (701, 702, 703) may communicate through wirings within the organic material layer 472, through the TSV structures 475 within the molding material layer 473, then through wirings within the non-organic material layer 421 to the package substrate 200. The organic material layer 472 may have a low Young's modulus, and may act as a stress buffer between the at least one semiconductor die (701, 702, 703) and the molding material layer 473 during high-stress thermal manufacturing cycles. The hybrid interposer 410 may therefore withstand high-temperature manufacturing cycles therefore allowing for a wider variety of integrated devices that may be embedded within the hybrid interposer 410.

The molding structure 471 including at least one molding material layer 473 may be provided within the hybrid interposer 410 to further increase the efficiency of and the structural integrity of the hybrid interposer. The molding structure 471, having a higher Young's modulus value as compared to the organic structure 470, may be implemented to reduce the stress of thermal expansion and contraction between thermal cycles of the manufacturing process. Thus, the chance for manufacturing defects to occur, as caused by the disparity between a Young's modulus value of the package substrate 200 and the at least one semiconductor die (701, 702, 703), may be reduced by the including the molding structure 471 within the hybrid interposer 410.

The combination of the organic structure 470, the non-organic structure 420, and the molding structure 471 forming a single hybrid interposer 410 may create the following benefits: (i) the organic structure 470 may enhance electrical performance of the at least one semiconductor die (701, 702, 703); (ii) the non-organic structure 420 may be used as a material to balance the structural integrity of the organic structure 470, especially during thermal cycles; and (iii) the molding structure 471 may have a higher Young's modulus and a lower first coefficient of thermal expansion as compared to other materials such as those forming the organic structure 470, therefore acting as a buffer between various heterogeneous layers (i.e., between organic structure 470 and non-organic structure 420).

By implementing the hybrid interposer 410, integrated devices (e.g., integrated device 54) may be safely embedded within the molding structure 471 during high-temperature manufacturing processes. Integrated devices may be formed within a hybrid interposer much closer to semiconductor dies than integrated devices formed within package substrates, thereby reducing the electrical communication pathway, or routing distance, and reducing processing times of the semiconductor device. Furthermore, forming the molding structure 471 between the non-organic structure 420 and the organic structure 470 may help prevent delamination throughout the manufacturing process, in which the molding structure 471 acts as an adhesive layer between the two heterogenous layers.

Figure 2:
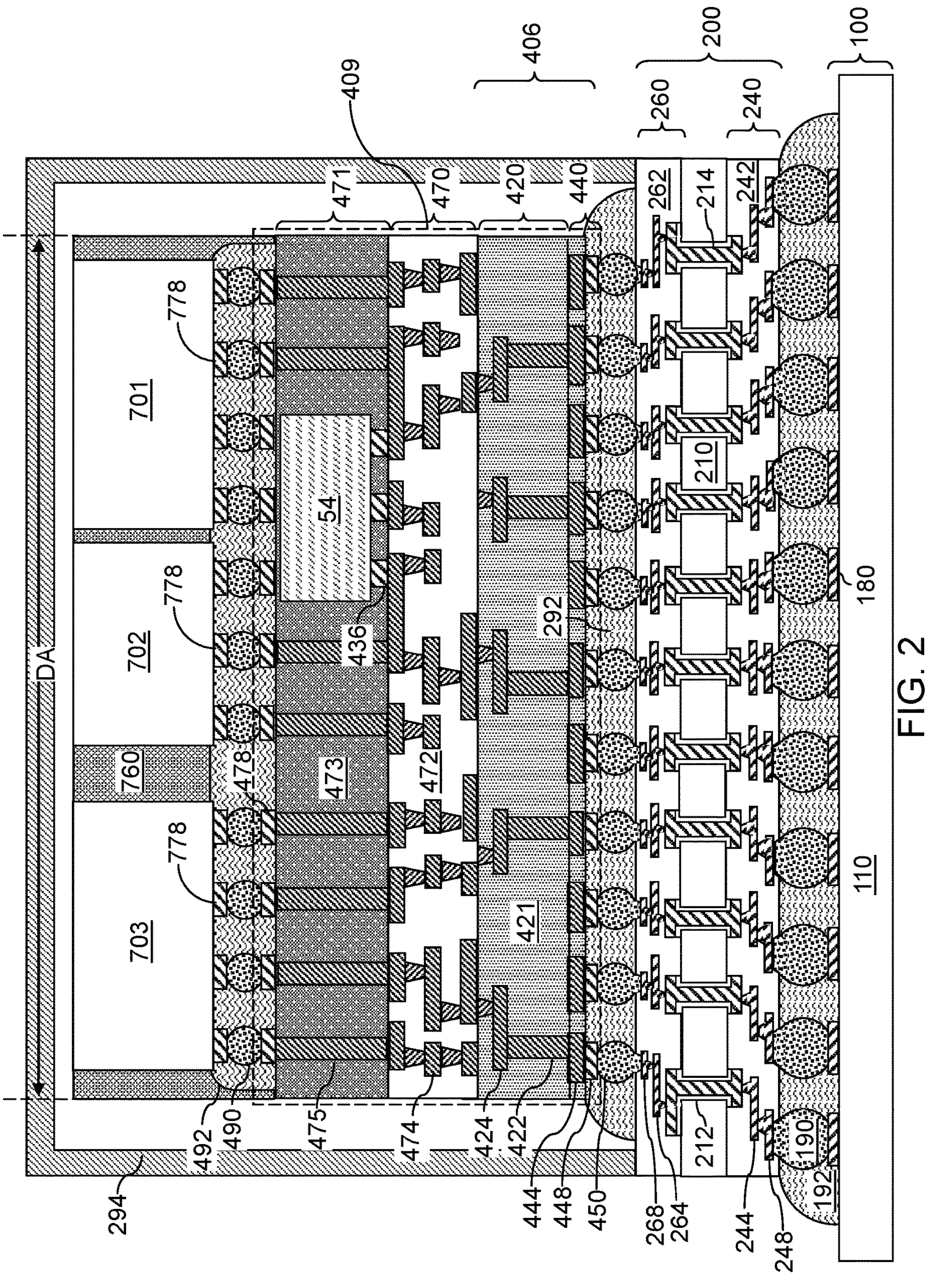
FIG. 2 is a vertical cross-sectional view of a region of an exemplary intermediate structure including a hybrid interposer according to an alternative embodiment of the present disclosure.

FIG. 2 is a vertical cross-sectional view of a region of a first alternate embodiment structure including a hybrid interposer 409 according to an embodiment of the present disclosure. Referring to FIG. 2, the first alternate embodiment structure illustrated may be formed in a similar manner according to the processes and techniques described with reference to FIGS. 1A-1L.

A hybrid interposer 409 may be formed from the non-organic structure 420, the package-side redistribution structure 440, the molding structure 471, and the organic structure 470. The hybrid interposer 409 may include non-organic material layer 406, molding material layer 473, and organic material layer 472. The non-organic material layer 406 may include the non-organic structure 420 and the package-side redistribution structure 440. Thus, the hybrid interposer 409 may include non-organic material layer 406, organic material layer 472, and molding material layer 473 positioned between the organic material layer 472 and the at least one semiconductor die (701, 702, 703).

The at least one semiconductor die (701, 702, 703) may communicate through the TSV structures 475 within the molding material layer 473, through wirings within the organic material layer 472, then through wirings within the non-organic material layer 421 to the package substrate 200. The organic material layer 472 may have a low Young's modulus, and may act as a stress buffer between the at least one semiconductor die (701, 702, 703) and the non-organic material layer 406 during high-stress thermal manufacturing cycles. The hybrid interposer 409 may therefore withstand high-temperature manufacturing cycles therefore allowing for a wider variety of integrated devices that may be embedded within the hybrid interposer 409.

The molding structure 471 including a molding material layer 473 may be provided within the hybrid interposer 409 to further increase the efficiency of and the structural integrity of the hybrid interposer. The molding structure 471, having a higher Young's modulus value as compared to the organic structure 470, may be implemented to reduce the stress of thermal expansion and contraction between thermal cycles of the manufacturing process. Thus, the chance for manufacturing defects to occur, as caused by the disparity between a Young's modulus value of the package substrate 200 and the at least one semiconductor die (701, 702, 703), may be reduced by the including the molding structure 471 within the hybrid interposer 409.

The combination of the organic structure 470, the non-organic structure 420, and the molding structure 471 forming a single hybrid interposer 409 may create the following benefits: (i) the organic structure 470 may enhance electrical performance of the at least one semiconductor die (701, 702, 703); (ii) the non-organic structure 420 may be used as a material to balance the structural integrity of the organic structure 470, especially during thermal cycles; and (iii) the molding structure 471 may have a higher Young's modulus and a lower first coefficient of thermal expansion as compared to other materials such as those forming the organic structure 470, therefore acting as a buffer between various heterogeneous layers (i.e., between organic structure 470 and the at least one semiconductor die (701, 702, 703)).

Specifically, implementing a molding structure 471 between an organic structure 470 and the at least one semiconductor die (701, 702, 703) may allow the molding structure 471 to provide higher electrical performance of the at least one semiconductor die (701, 702, 703) as a result of minimizing the physical length of electrical communication pathways between the at least one semiconductor die (701, 702, 703) and the integrated device 54.

Figure 3:
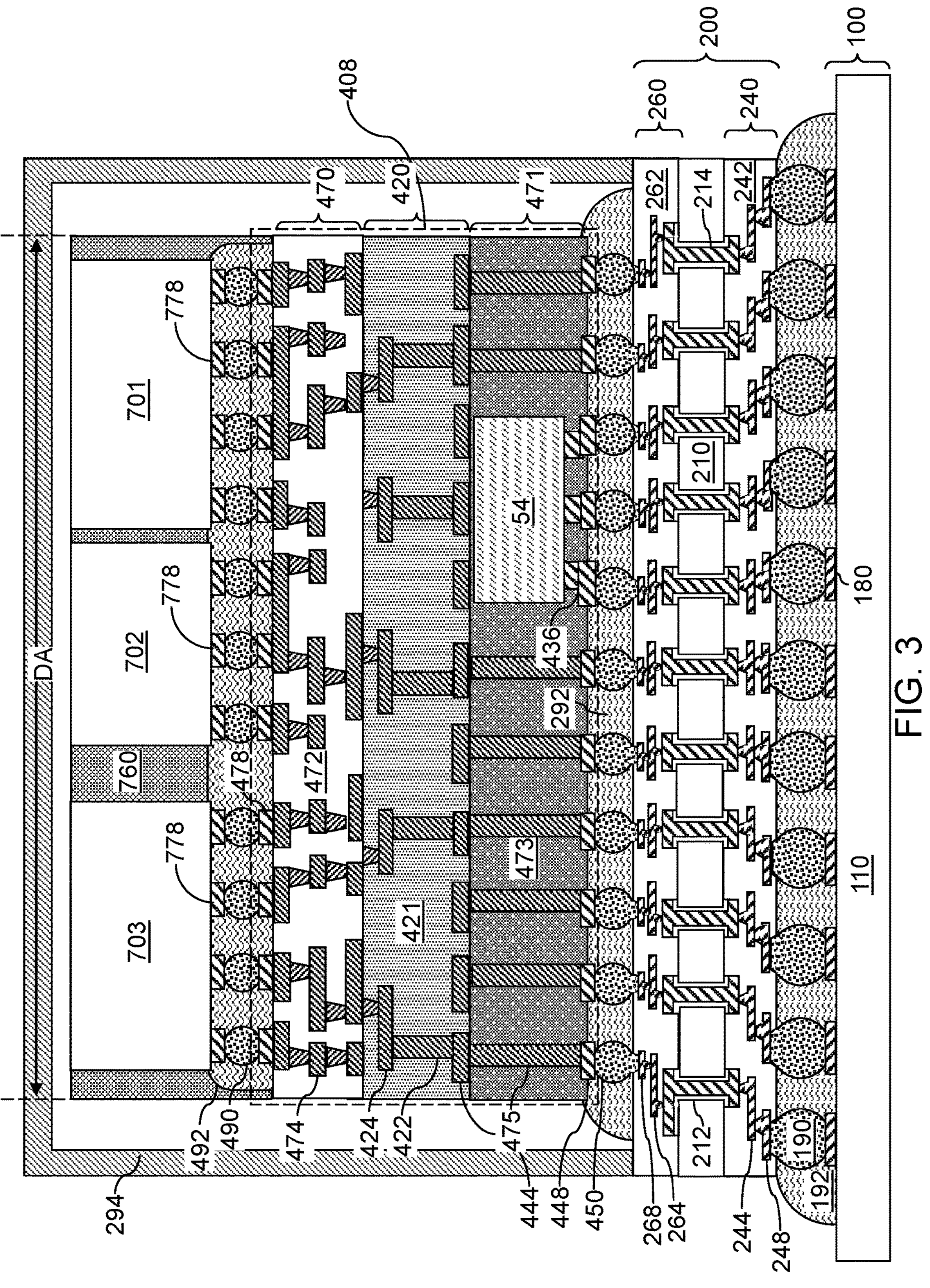
FIG. 3 is a vertical cross-sectional view of a region of an exemplary intermediate structure including a hybrid interposer according to another alternative embodiment of the present disclosure.

FIG. 3 is a vertical cross-sectional view of a region of a second alternate embodiment structure including a hybrid interposer 408 according to an embodiment of the present disclosure. Referring to FIG. 3, the second alternate embodiment structure illustrated may be formed in a similar manner according to the processes and techniques described with reference to FIGS. 1A-1L.

A hybrid interposer 408 may be formed from the non-organic structure 420, the molding structure 471, and the organic structure 470. The hybrid interposer 408 may include non-organic material layer 421, molding material layer 473, and organic material layer 472. The molding material layer 473 may be positioned between the non-organic material layer 421 and the package substrate 200.

The at least one semiconductor die (701, 702, 703) may communicate through wirings within the organic material layer 472, through wirings within the non-organic material layer 421, then through the TSV structures 475 within the molding material layer 473 to the package substrate 200. The organic material layer 472 may have a low Young's modulus, and may act as a stress buffer between the at least one semiconductor die (701, 702, 703) and the non-organic material layer 421 during high-stress thermal manufacturing cycles. The hybrid interposer 408 may therefore withstand high-temperature manufacturing cycles therefore allowing for a wider variety of integrated devices that may be embedded within the hybrid interposer 408.

The molding structure 471 including a molding material layer 473 may be provided within the hybrid interposer 409 to further increase the efficiency of and the structural integrity of the hybrid interposer. The molding structure 471, having a higher Young's modulus value as compared to the organic structure 470, may be implemented to reduce the stress of thermal expansion and contraction between thermal cycles of the manufacturing process. Thus, the chance for manufacturing defects to occur, as caused by the disparity between a Young's modulus value of the package substrate 200 and the at least one semiconductor die (701, 702, 703), may be reduced by the including the molding structure 471 within the hybrid interposer 409.

The combination of the organic structure 470, the non-organic structure 420, and the molding structure 471 forming a single hybrid interposer 408 may create the following benefits: (i) the organic structure 470 may enhance electrical performance of the at least one semiconductor die (701, 702, 703); (ii) the non-organic structure 420 may be used as a material to balance the structural integrity of the organic structure 470, especially during thermal cycles; and (iii) the molding structure 471 may have a higher Young's modulus and a lower first coefficient of thermal expansion as compared to other materials such as those forming the organic structure 470, therefore acting as a buffer between various heterogeneous layers (i.e., between non-organic structure 420 and the package substrate 200).

Specifically, implementing a molding structure 471 between a non-organic structure 420 and the package substrate 200 may allow for the implementation of a wider variety of integrated devices (e.g., integrated device 54). Implementing the molding structure 471 closer to or adjacent to the package substrate 200 allow for the usage of other various integrated devices, such that larger integrated device dimensions and pad sizes may be implemented closer to the package substrate.

Figure 4:
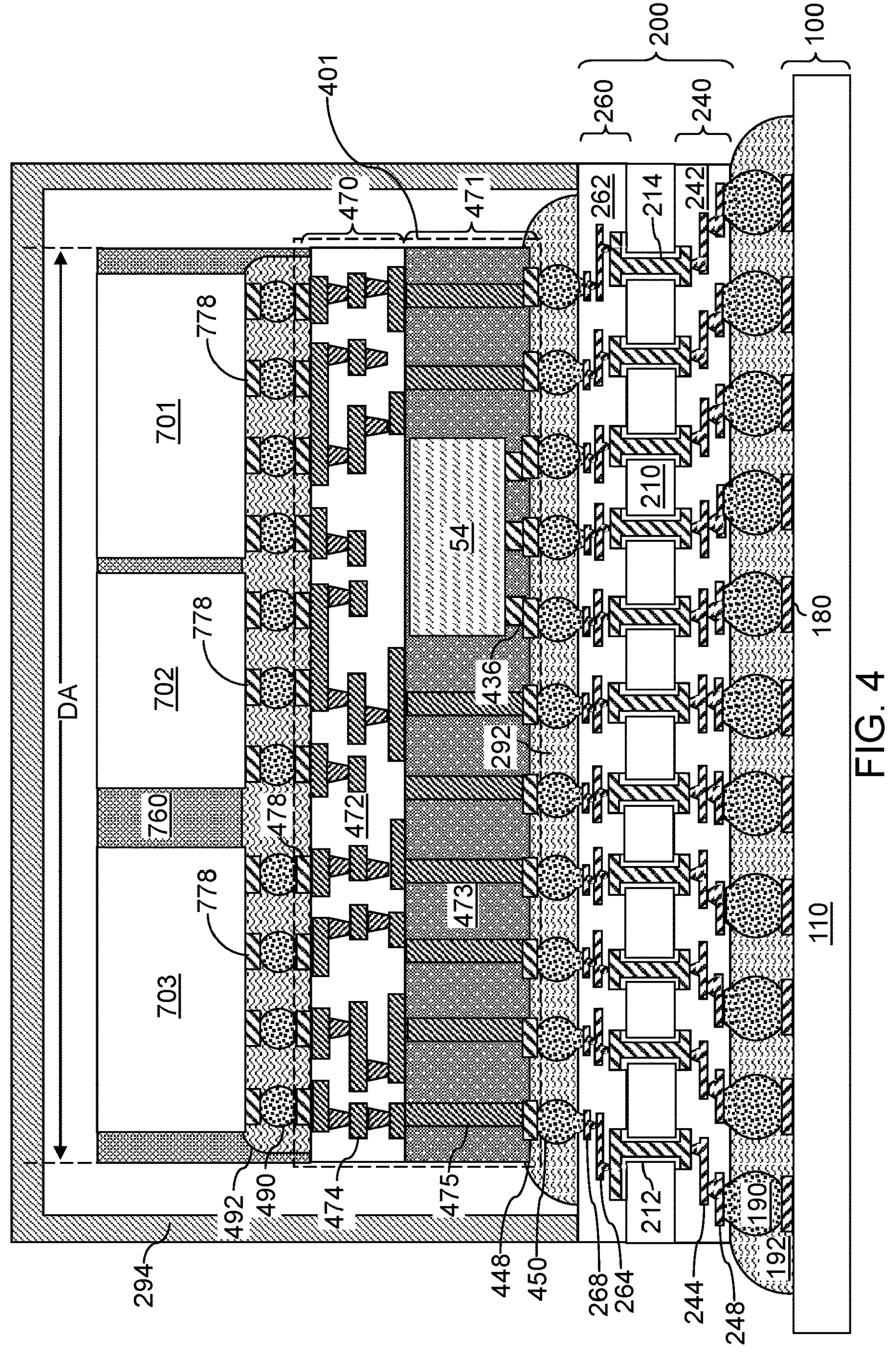
FIG. 4 is a vertical cross-sectional view of a region of an exemplary intermediate structure including a hybrid interposer according to another alternative embodiment of the present disclosure.

FIG. 4 is a vertical cross-sectional view of a region of a third alternate embodiment structure including a hybrid interposer 408 according to an embodiment of the present disclosure. Referring to FIG. 4, the third alternate embodiment structure illustrated may be formed in a similar manner according to the processes and techniques described with reference to FIGS. 1A-1L. A hybrid interposer 401 may be formed from the molding structure 471 and the organic structure 470. The hybrid interposer 408 may include molding material layer 473 and organic material layer 472. The molding material layer 473 may be positioned between the organic material layer 472 and the package substrate 200.

Figure 5:
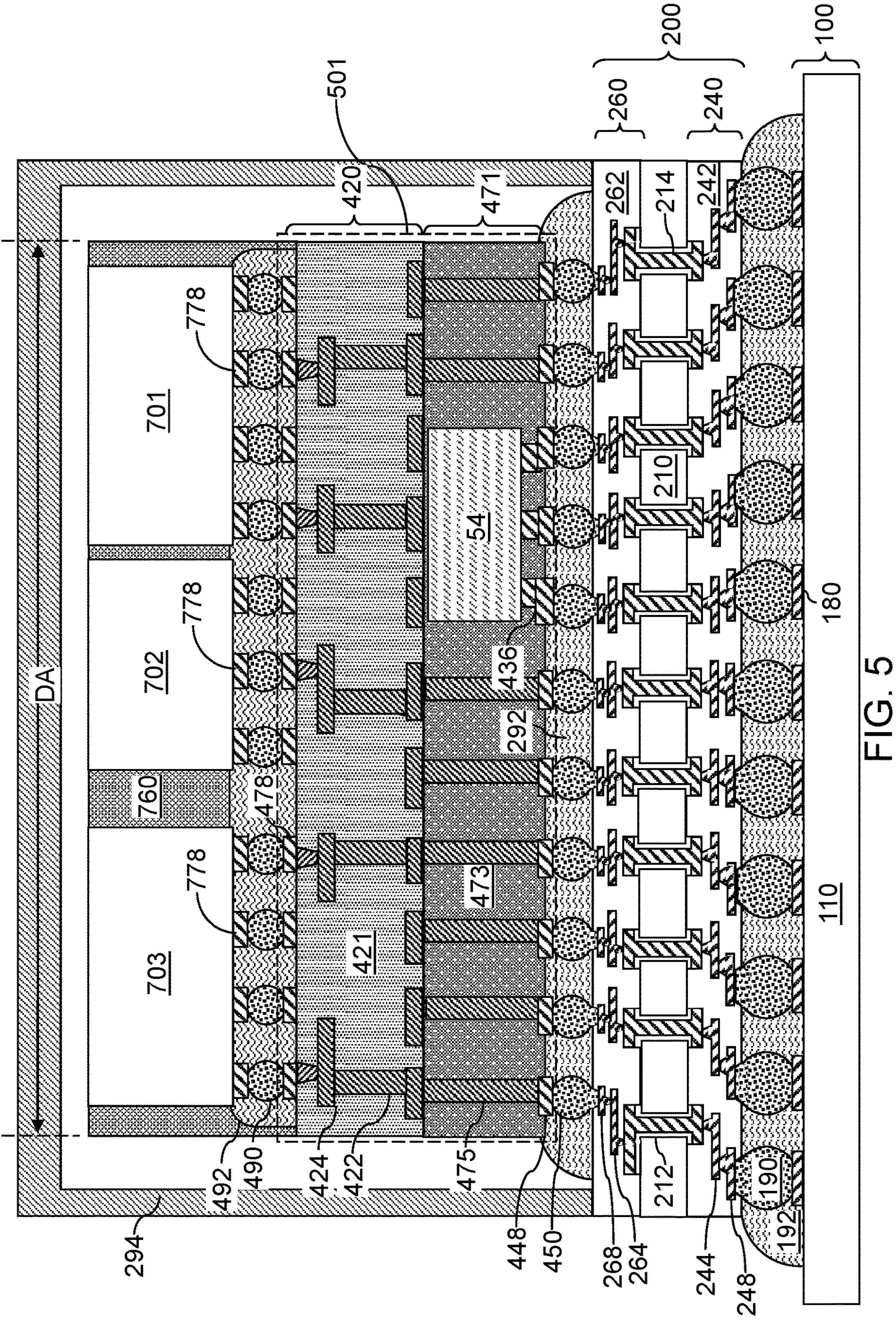
FIG. 5 is a vertical cross-sectional view of a region of an exemplary intermediate structure including a hybrid interposer according to another alternative embodiment of the present disclosure.

FIG. 5 is a vertical cross-sectional view of a region of a fourth alternate embodiment structure including a hybrid interposer 501 according to an embodiment of the present disclosure. Referring to FIG. 5, the fourth alternate embodiment structure illustrated may be formed in a similar manner according to the processes and techniques described with reference to FIGS. 1A-1L. A hybrid interposer 501 may be formed from the non-organic structure 420 and the molding structure 471. The hybrid interposer 501 may include non-organic material layer 421 and the molding material layer 473. The molding material layer 473 may be positioned between the non-organic material layer 421 and the package substrate 200.

Figure 6:
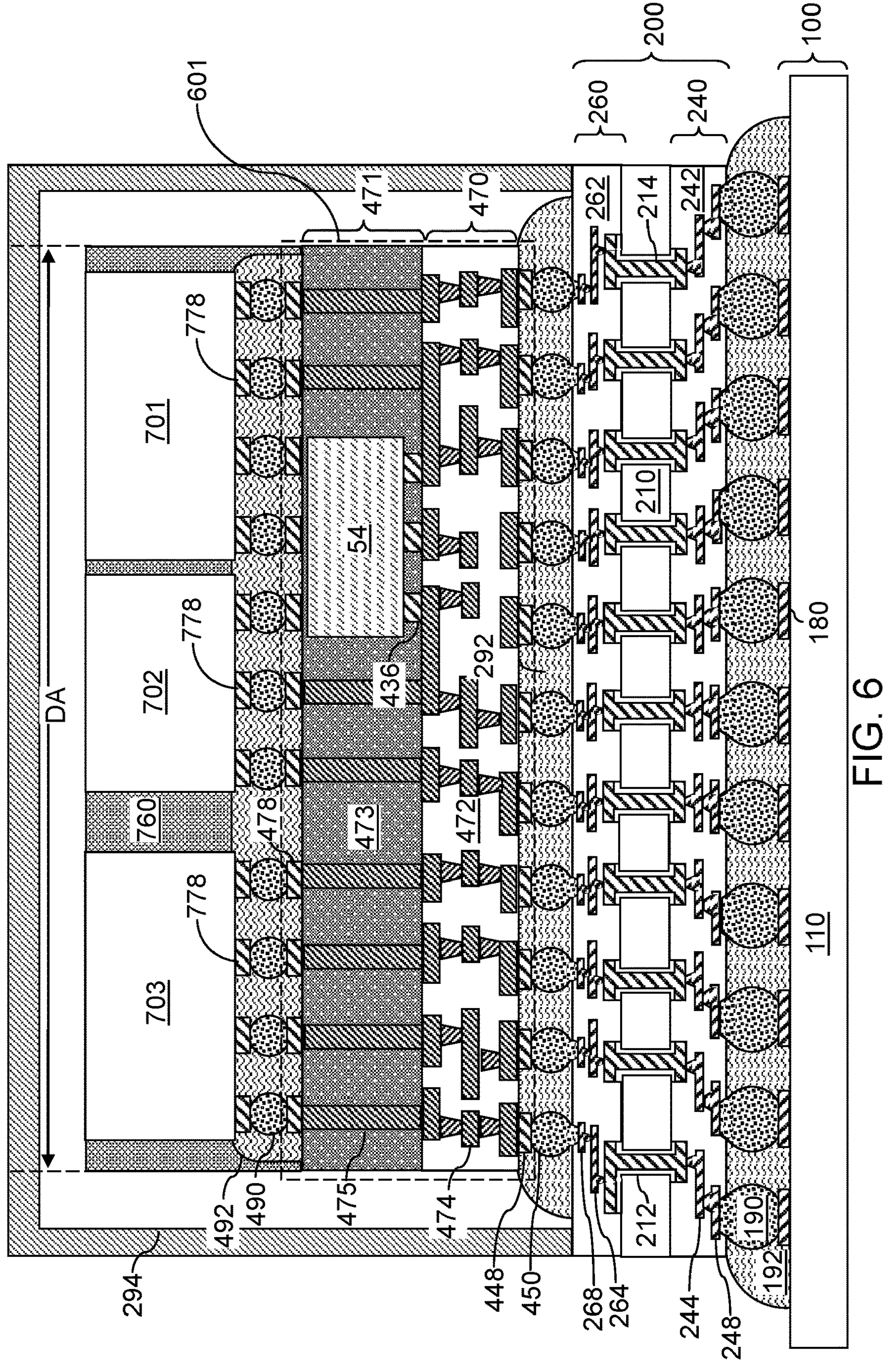
FIG. 6 is a vertical cross-sectional view of a region of an exemplary intermediate structure including a hybrid interposer according to another alternative embodiment of the present disclosure.

FIG. 6 is a vertical cross-sectional view of a region of a fifth alternate embodiment structure including a hybrid interposer 601 according to an embodiment of the present disclosure. Referring to FIG. 6, the fifth alternate embodiment structure illustrated may be formed in a similar manner according to the processes and techniques described with reference to FIGS. 1A-1L. A hybrid interposer 601 may be formed from the molding structure 471 and the organic structure 470. The hybrid interposer 601 may include molding material layer 473 and organic material layer 472. The molding material layer 473 may be positioned between the organic material layer 472 and the at least one semiconductor die (701, 702, 703).

Figure 7:
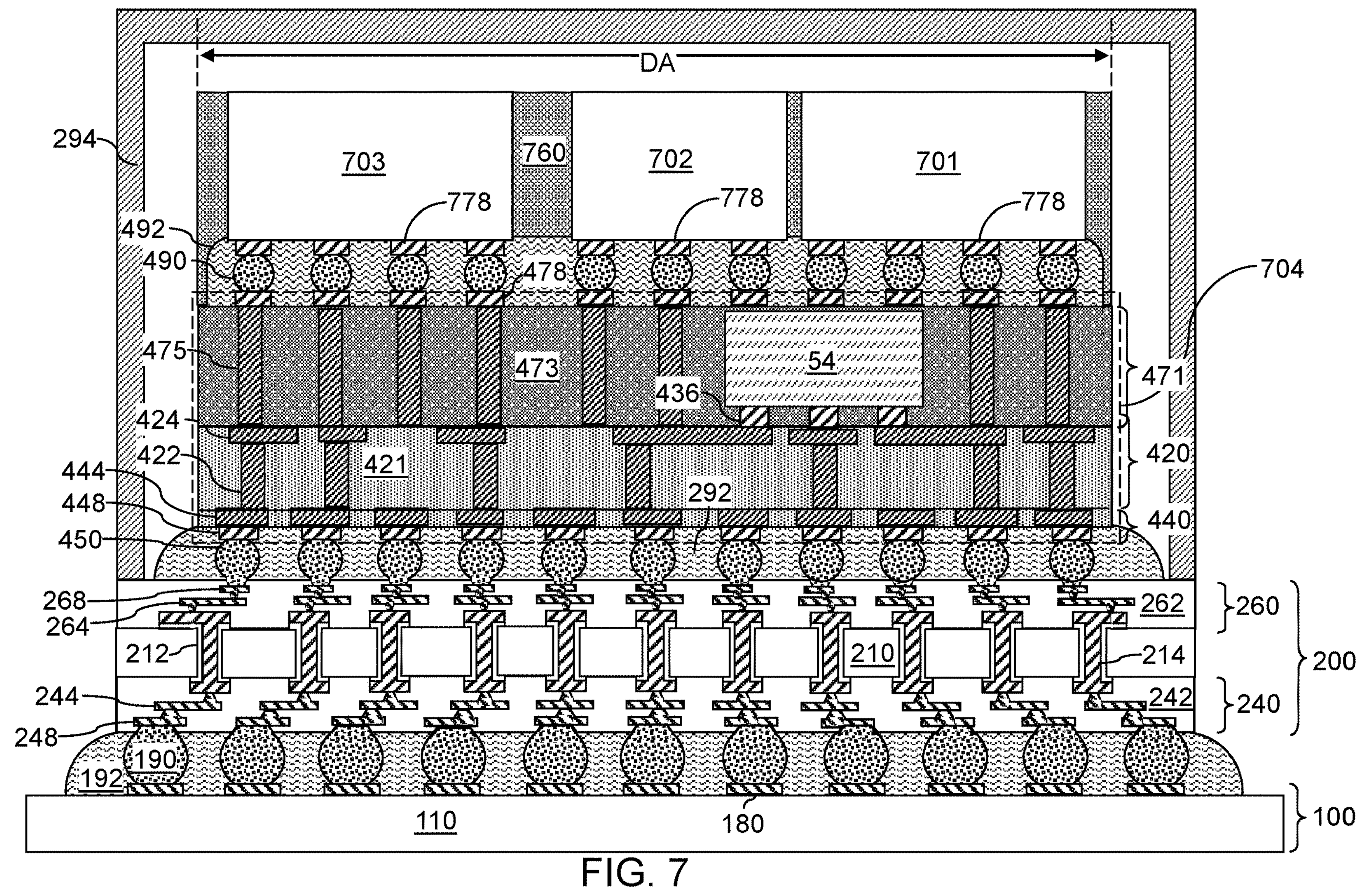
FIG. 7 is a vertical cross-sectional view of a region of an exemplary intermediate structure including a hybrid interposer according to another alternative embodiment of the present disclosure.

FIG. 7 is a vertical cross-sectional view of a region of a sixth alternate embodiment structure including a hybrid interposer 704 according to an embodiment of the present disclosure. Referring to FIG. 7, the sixth alternate embodiment structure illustrated may be formed in a similar manner according to the processes and techniques described with reference to FIGS. 1A-1L. A hybrid interposer 704 may be formed from the molding structure 471 and the non-organic structure 420. The hybrid interposer 704 may include molding material layer 473 and non-organic material layer 421. The molding material layer 473 may be positioned between the non-organic material layer 421 and the at least one semiconductor die (701, 702, 703).

Figure 8:
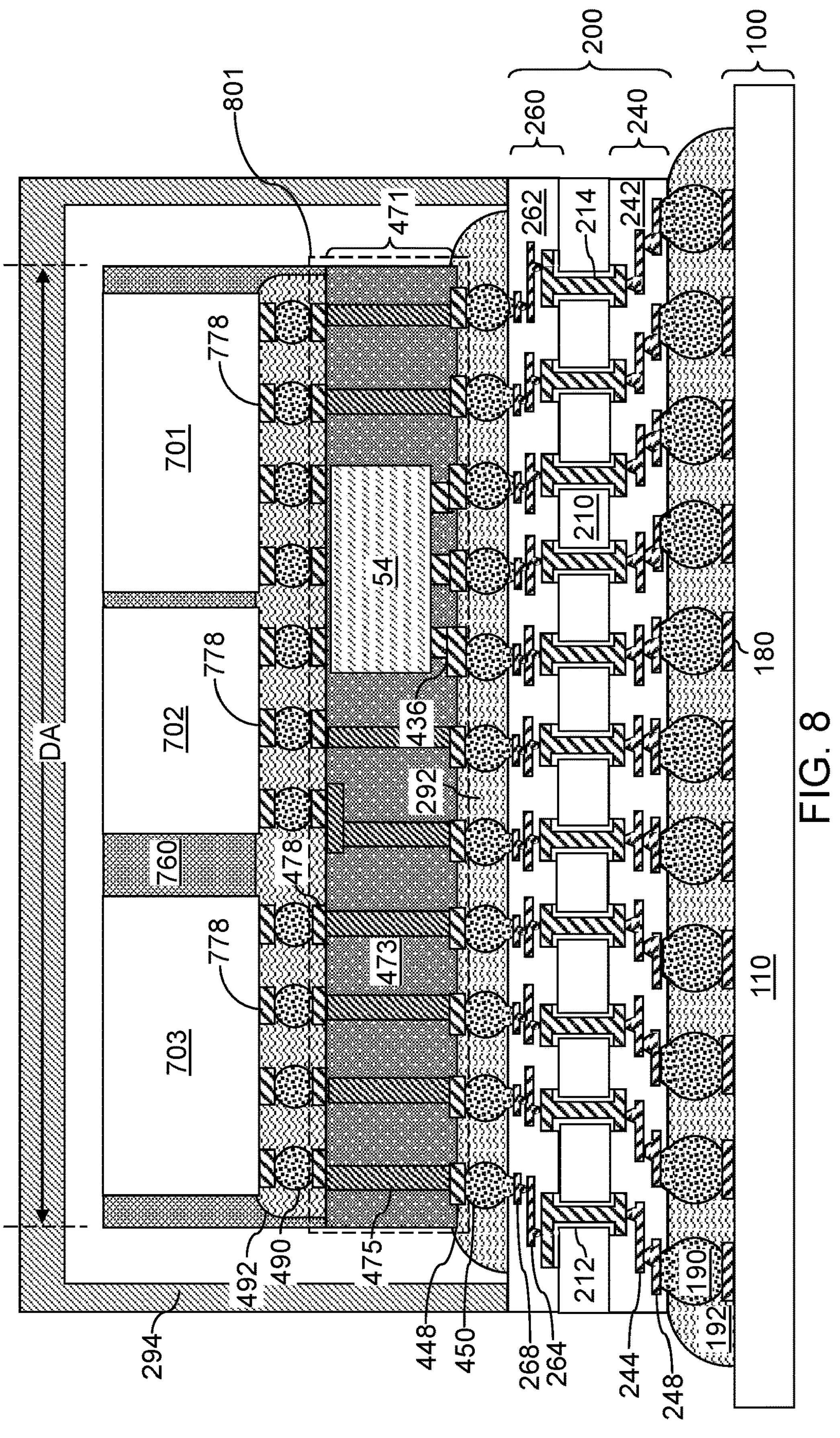
FIG. 8 is a vertical cross-sectional view of a region of an exemplary intermediate structure including a hybrid interposer according to another alternative embodiment of the present disclosure.

FIG. 8 is a vertical cross-sectional view of a region of a seventh alternate embodiment structure including a molding interposer 801 according to an embodiment of the present disclosure. Referring to FIG. 8, the seventh alternate embodiment structure illustrated may be formed in a similar manner according to the processes and techniques described with reference to FIGS. 1A-1L. A molding interposer 801 may be formed from the molding structure 471. The molding interposer 801 may include molding material layer 473. The molding material layer 473 may be positioned between the at least one semiconductor die (701, 702, 703) and the package substrate 200.

Figure 9:
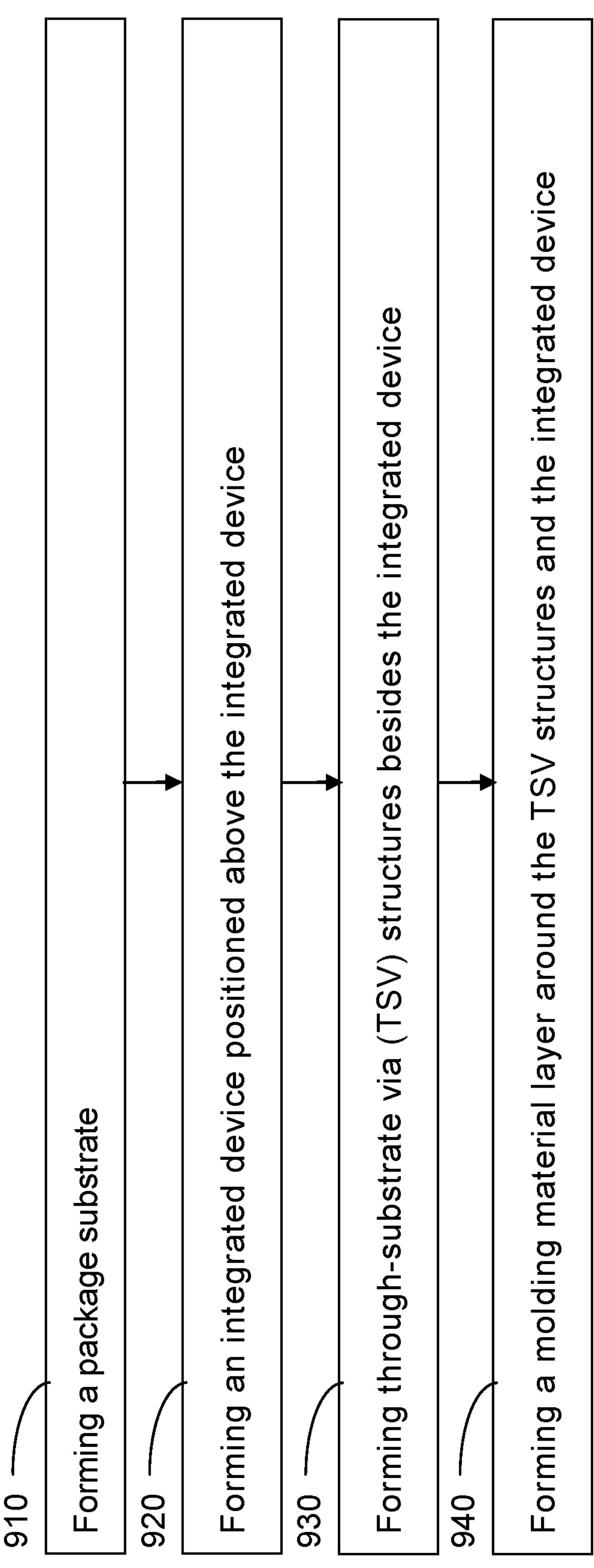
FIG. 9 is a flowchart illustrating steps for forming hybrid interposer structure according to an embodiment of the present disclosure.

FIG. 9 is a flowchart illustrating steps for forming hybrid interposer structure according to an embodiment of the present disclosure. Referring to step 910 and FIGS. 1K, and 2-8, a package substrate 200 may be formed. Referring to step 920 and all drawings, a hybrid interposer (e.g., hybrid interposer 401, 408, 409, 410, 501, 601, 704, molding interposer 801) may be formed by forming an integrated device 54 positioned above the package substrate 200. Referring to step 930 and FIGS. 1C and 2-8, a hybrid interposer (e.g., hybrid interposer 401, 408, 409, 410, 501, 601, 704, molding interposer 801) may be further formed by forming through-substrate via (TSV) structures 475 besides the integrated device 54. Referring to step 940 and FIGS. 1C and 2-8, a hybrid interposer (e.g., hybrid interposer 401, 408, 409, 410, 501, 601, 704, molding interposer 801) may be further formed by forming a molding material layer 473 around the TSV structures 475 and the integrated device 54.

In one embodiment, referring to FIGS. 1K and 7, forming the hybrid interposer (e.g., hybrid interposer 410, 704) may further include depositing a non-organic material layer 412 over the package substrate 200, in which forming the molding material layer 473 may further include forming the molding material layer 473 over the non-organic material layer 421. In one embodiment, referring to FIG. 1D, forming the hybrid interposer (e.g., hybrid interposer 410) may further include depositing an organic material layer 472 over the molding material layer 473.

In one embodiment, referring to FIGS. 2 and 6, forming the hybrid interposer (e.g., hybrid interposer 409, 601) may further include depositing an organic material layer 472, in which forming the molding material layer 473 may further include forming the molding material layer 473 over the organic material layer 472. In one embodiment, referring to FIG. 2, forming the hybrid interposer (e.g., hybrid interposer 409) may further include depositing a non-organic material layer 421 over the package substrate 200, wherein depositing the organic material layer 472 may further include depositing the organic material layer 472 over the non-organic material layer 421.

In one embodiment, referring to FIGS. 3-5, and 8, forming the molding material layer 473 may further include forming the molding material layer 473 over the package substrate 200. In one embodiment, referring to FIGS. 3 and 5, forming the hybrid interposer (e.g., hybrid interposer 408, 501) may further include depositing a non-organic material layer 421 over the molding material layer 473. In one embodiment, referring to FIG. 3, forming the hybrid interposer (e.g., hybrid interposer 408) may further include depositing an organic material layer 472 over the non-organic material layer 421.

In one embodiment, referring to FIG. 1C and 2-8, forming the hybrid interposer (e.g., hybrid interposer 401, 408, 409, 410, 501, 601, 704, molding interposer 801) may further include forming through-substrate via (TSV) structures 475 in the molding material layer 473, in which the integrated device 54 is electrically connected to the package substrate 200 through the TSV structures 475, and in which the TSV structures 475 are integrated vias positioned besides the integrated device 54 and extend through a depth of the molding material layer 473.

Referring to all drawings and according to various embodiments of the present disclosure, a semiconductor device is provided. The semiconductor device may include a semiconductor die (701, 702, 703), a package substrate 200, an interposer (e.g., hybrid interposer 401, 408, 409, 410, 501, 601, 704, molding interposer 801) positioned between the semiconductor die (701, 702, 703) and the package substrate 200. The interposer (e.g., hybrid interposer 401, 408, 409, 410, 501, 601, 704, molding interposer 801) may include a molding material layer 473, an integrated device 54 positioned within the molding material layer 473, and through-substrate via (TSV) structures 475 positioned within the molding material layer 473.

In one embodiment, the hybrid interposer (e.g., hybrid interposer 401, 408, 409, 410, 501, 601, 704) may further include an organic material layer 472, and a non-organic material layer 421. In one embodiment, the molding material layer 473 may be positioned between the organic material layer 472 and the non-organic material layer 421. In one embodiment, the molding material layer 473 may be positioned between the semiconductor die (701, 702, 703) and the organic material layer 472. In one embodiment, the molding material layer 473 may be positioned between the non-organic material layer 421 and the package substrate 200.

In one embodiment, the organic material layer 472 may have a first Young's modulus value that is less than a second Young's modulus value of the non-organic material layer 421, and the molding material layer 473 may have a first coefficient of thermal expansion that is lower than a second coefficient of thermal expansion of the organic material layer 472.

In one embodiment, the organic material layer 472 may include a dielectric polymer material. In one embodiment, the non-organic material layer 421 may include a silicon-based dielectric material. In one embodiment, the semiconductor device may further include through-substrate via (TSV) structures 475 formed within the molding material layer 473, in which the integrated device 54 is electrically connected to the semiconductor die (701, 702, 703) and the package substrate 200 through the TSV structures 475, and in which the TSV structures 475 are integrated vias positioned besides the integrated device 54 and extend through a depth of the molding material layer 473.

Referring to all drawings and according to various embodiments of the present disclosure, a semiconductor package is provided. The semiconductor package may include a package substrate 200, and a hybrid interposer (e.g., hybrid interposer 401, 408, 409, 410, 501, 601, 704) positioned above the package substrate 200. The hybrid interposer (e.g., hybrid interposer 401, 408, 409, 410, 501, 601, 704) may include an organic material layer 472, a non-organic material layer 421, a molding material layer 473 positioned between the organic material layer and the non-organic material layer, and an integrated device 54 positioned within the molding material layer 473, in which the organic material layer 472 has a first Young's modulus value that is less than a second Young's modulus value of the non-organic material layer 421, and the molding material layer 473 has a first coefficient of thermal expansion that is lower than a second coefficient of thermal expansion of the organic material layer 472. In one embodiment, the molding material layer 473 may include an epoxy molding compound (EMC).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:

forming a package substrate comprising a glass epoxy plate, a board-side surface laminar circuit (SLC) disposed on a board side of the glass epoxy plate, a chip-side SLC disposed on an opposing chip side of the glass epoxy plate, and through-core via structures that extend through the glass epoxy plate to electrically connect the board-side SLC and the chip-side SLC; and forming a hybrid interposer over a first side of the package substrate by:

depositing an organic material layer;

depositing a non-organic material layer;

forming an integrated passive device positioned above the package substrate;

forming through-substrate via (TSV) structures beside the integrated passive device; and forming a molding material layer embedding the TSV structures and the integrated passive device, wherein the molding material layer has a higher Young's modulus than a Young's modulus of the organic material layer;

wherein:

the integrated passive device comprises a resistor, a capacitor, an inductor, a microstrip line, or an impedance matching element and is electrically connected to the package substrate through via device bumps embedded in the molding material layer; and the via device bumps, the TSV structures, and portions of the integrated passive device are formed by:

depositing a metallic seed layer;

depositing a photoresist layer on the metallic seed layer;

patterning the photoresist layer to expose portions of the seed layer;

depositing a metallic fill material onto the exposed portions of the photoresist layer;

removing the photoresist layer; and etching portions of the metallic seed layer exposed by the removal of the photoresist layer.

2. The method of claim 1, wherein the molding material layer is deposited on the non-organic material layer or the organic material layer.

3. The method of claim 2, wherein the organic material layer is deposited on the molding material layer.

4. The method of claim 1, wherein the organic material layer is deposited on the non-organic material layer.

5. The method of claim 1, wherein the non-organic material layer is deposited on the molding material layer.

6. The method of claim 5, wherein the organic material layer is deposited on the non-organic material layer.

7. The method of claim 1, wherein the integrated passive device is electrically connected to the package substrate through the TSV structures, and wherein the TSV structures are integrated vias positioned besides the integrated passive device and extend through a depth of the molding material layer.

8. A method of forming a semiconductor structure, comprising:

forming a hybrid interposer by:

forming a non-organic structure comprising wiring interconnects and through-substrate via (TSV) structures embedded in a non-organic material layer;

forming an organic structure on the non-organic structure, the organic structure comprising wiring interconnects and TSV structures embedded in an organic material layer; and forming a molding structure on the organic structure, the molding structure comprising an integrated passive device and TSV structures embedded in a molding material layer;

bonding a semiconductor die to a first side of the hybrid interposer; and bonding a package substrate to a second side of the hybrid interposer, the package substrate comprising a glass epoxy plate, a board-side surface laminar circuit (SLC) disposed on a board side of the glass epoxy plate, a chip-side SLC disposed on an opposing chip side of the glass epoxy plate, and through-core via structures that extend through the glass epoxy plate to electrically connect the board-side SLC and the chip-side SLC, wherein a Young's modulus of the molding structure is greater than a Young's modulus of the organic structure;

wherein:

the integrated passive device comprises a resistor, a capacitor, an inductor, a microstrip line, or an impedance matching element and is electrically connected to the package substrate through via device bumps embedded in the molding material layer; and the via device bumps, the TSV structures, and portions of the integrated passive device are formed by:

depositing a metallic seed layer;

depositing a photoresist layer on the metallic seed layer;

patterning the photoresist layer to expose portions of the seed layer;

depositing a metallic fill material onto the exposed portions of the photoresist layer;

removing the photoresist layer; and etching portions of the metallic seed layer exposed by the removal of the photoresist layer.

9. The method of claim 8, wherein the organic structure is disposed between the molding structure and the non-organic structure.

10. The method of claim 9, wherein the non-organic structure is disposed between the organic structure and the package substrate.

11. The method of claim 9, wherein the molding material layer is disposed between the organic structure and the semiconductor die.

12. The method of claim 8, wherein a coefficient of thermal expansion of the molding material layer is lower than a coefficient of thermal expansion of the organic material layer.

13. The method of claim 12, wherein the integrated passive device comprises a resistor, a capacitor, an inductor, a microstrip line, or an impedance matching element.

14. The method of claim 8, wherein:

the non-organic material layer comprises a silicon-based material; and the organic material layer comprises an organic polymer material.

15. A method of forming a semiconductor structure, comprising:

forming a hybrid interposer by:

forming an organic structure comprising wiring interconnects and through-substrate via (TSV) structures embedded in an organic material layer;

forming a non-organic structure on the organic structure, the non-organic structure comprising wiring interconnects and TSV structures embedded in a non-organic material layer; and forming a molding structure on the non-organic structure, the molding structure comprising an integrated passive device and TSV structures embedded in a molding material layer;

bonding a semiconductor die to a first side of the hybrid interposer; and bonding a package substrate to a second side of the hybrid interposer, the package substrate comprising a glass epoxy plate, a board-side surface laminar circuit (SLC) disposed on a board side of the glass epoxy plate, a chip-side SLC disposed on an opposing chip side of the glass epoxy plate, and through-core via structures that extend through the glass epoxy plate to electrically connect the board-side SLC and the chip-side SLC, wherein a coefficient of thermal expansion of the molding material layer is lower than a coefficient of thermal expansion of the organic material layer, and wherein a Young's modulus of the molding structure is greater than a Young's modulus of the organic structure;

wherein:

the integrated passive device comprises a resistor, a capacitor, an inductor, a microstrip line, or an impedance matching element and is electrically connected to the package substrate through via device bumps embedded in the molding material layer; and the via device bumps, the TSV structures, and portions of the integrated passive device are formed by:

depositing a metallic seed layer;

depositing a photoresist layer on the metallic seed layer;

patterning the photoresist layer to expose portions of the seed layer;

depositing a metallic fill material onto the exposed portions of the photoresist layer;

removing the photoresist layer; and etching portions of the metallic seed layer exposed by the removal of the photoresist layer.

16. The method of claim 15, wherein the organic structure is disposed between the non-organic structure and the semiconductor die.

17. The method of claim 15, wherein the molding structure is disposed between the non-organic structure and the package substrate.

18. The method of claim 15, wherein:

the integrated passive device comprises a resistor, a capacitor, an inductor, a microstrip line, or an impedance matching element;

the non-organic material layer comprises a silicon-based material;

the organic material layer comprises an organic polymer material; and a coefficient of thermal expansion of the molding material layer is lower than a coefficient of thermal expansion of the organic material layer.

* * * * *